United States Patent
Kato et al.

(10) Patent No.: US 6,972,487 B2
(45) Date of Patent: Dec. 6, 2005

(54) MULTI CHIP PACKAGE STRUCTURE HAVING A PLURALITY OF SEMICONDUCTOR CHIPS MOUNTED IN THE SAME PACKAGE

(75) Inventors: Yoshiharu Kato, Kasugai (JP); Satoru Kawamoto, Kasugai (JP); Fumihiko Taniguchi, Kawasaki (JP); Tetsuya Hiraoka, Kawasaki (JP); Akira Takashima, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 136 days.

(21) Appl. No.: 10/058,877

(22) Filed: Jan. 25, 2002

(65) Prior Publication Data

US 2002/0140107 A1 Oct. 3, 2002

Related U.S. Application Data

(63) Continuation of application No. PCT/JP01/02755, filed on Mar. 30, 2001.

(51) Int. Cl.⁷ .............................. H01L 23/52
(52) U.S. Cl. .................................. 257/723
(58) Field of Search .................. 257/678, 685, 257/686, 690, 691, 698, 723, 730, 724, 777, 787, 778, 734, 48, 707; 361/728; 365/244; 438/106–109, 121–127

(56) References Cited

U.S. PATENT DOCUMENTS

| 5,640,107 A | * | 6/1997 | Kruse ........................... 326/38 |
| 5,754,405 A | * | 5/1998 | Derouiche ..................... 361/744 |
| 5,949,139 A | | 9/1999 | Imura et al. |
| 6,043,539 A | * | 3/2000 | Sugasawara ................ 257/357 |
| 6,081,429 A | * | 6/2000 | Barrett ........................ 361/767 |
| 6,116,493 A | * | 9/2000 | Tanaka ........................ 228/105 |
| 6,125,069 A | * | 9/2000 | Aoki ........................ 365/225.7 |
| 6,157,213 A | * | 12/2000 | Voogel ........................ 326/41 |
| 6,208,018 B1 | * | 3/2001 | Ma et al. ..................... 257/669 |
| 6,359,340 B1 | * | 3/2002 | Lin et al. ..................... 257/777 |
| 6,362,651 B1 | * | 3/2002 | Voogel ........................ 326/41 |
| 6,365,966 B1 | * | 4/2002 | Chen et al. .................. 257/723 |
| 6,392,304 B1 | * | 5/2002 | Butler ........................ 257/777 |
| 6,407,456 B1 | * | 6/2002 | Ball ........................... 257/777 |
| 6,580,164 B1 | * | 6/2003 | Ohie .......................... 257/690 |
| 2002/0135055 A1 | * | 9/2002 | Cho et al. .................... 257/678 |

FOREIGN PATENT DOCUMENTS

| EP | 0 907 207 A3 | 6/1999 |
| JP | 62136844 | * 6/1987 |

(Continued)

OTHER PUBLICATIONS

Langenkamp et al., "A Low–Cost MCM Implementation for 100–Hz TV Up–conversion", Apr. 1998, Multichip Modules and High Density Packaging, 7th International Conference, pp. 537–542.*

(Continued)

*Primary Examiner*—Evan Pert
(74) *Attorney, Agent, or Firm*—Armstrong, Kratz, Quintos, Hanson & Brooks, LLP

(57) ABSTRACT

The present invention relates to a semiconductor device having an MCP (Multi Chip Package) structure in which a plurality of semiconductor chips are mounted in the same package, a manufacturing method therefor and a semiconductor Substrate used therein. Atop a first semiconductor chip that is a memory chip is mounted a second Semiconductor chip that is a logic chip, with a first functional chip and a second functional chip that together form the first semiconductor chip being joined together via an unsliced scribe line. Additionally, a first functional chip and a second functional chip are given the same chip composition (32-bit memory) and respectively rotated 180 degrees relative to each other. These configurations are intended to improve performance, reduce costs and improve yield.

14 Claims, 21 Drawing Sheets

FOREIGN PATENT DOCUMENTS

| | | |
|---|---|---|
| JP | 2-122559 | 5/1990 |
| JP | 4-7867 | 1/1992 |
| JP | 6-177321 | 6/1994 |
| JP | 07-94617 * | 4/1995 |
| JP | 8-222514 | 8/1996 |
| JP | 9-219419 | 8/1997 |
| JP | 10-144862 | 5/1998 |
| JP | 10-321742 | 12/1998 |
| JP | 11-74464 | 1/1999 |
| JP | 11-31781 | 2/1999 |
| JP | 11-145403 | 5/1999 |
| JP | 11-168185 | 6/1999 |
| JP | 11-330256 | 11/1999 |
| JP | 11-354714 | 12/1999 |
| JP | 2000-223651 | 8/2000 |
| WO | WO 99/60618 | 11/1999 |

OTHER PUBLICATIONS

Gross et al., "ESD Qualification and Testing of Semiconductor Electronic Components", May 1996, Electronic Components and Technology Conference, 46th, pp. 671–681.*

Warner, Integrated Circuits Design Priciples and Fabrication, 1965, McGraw–Hill Book Company, 334–338.*

* cited by examiner

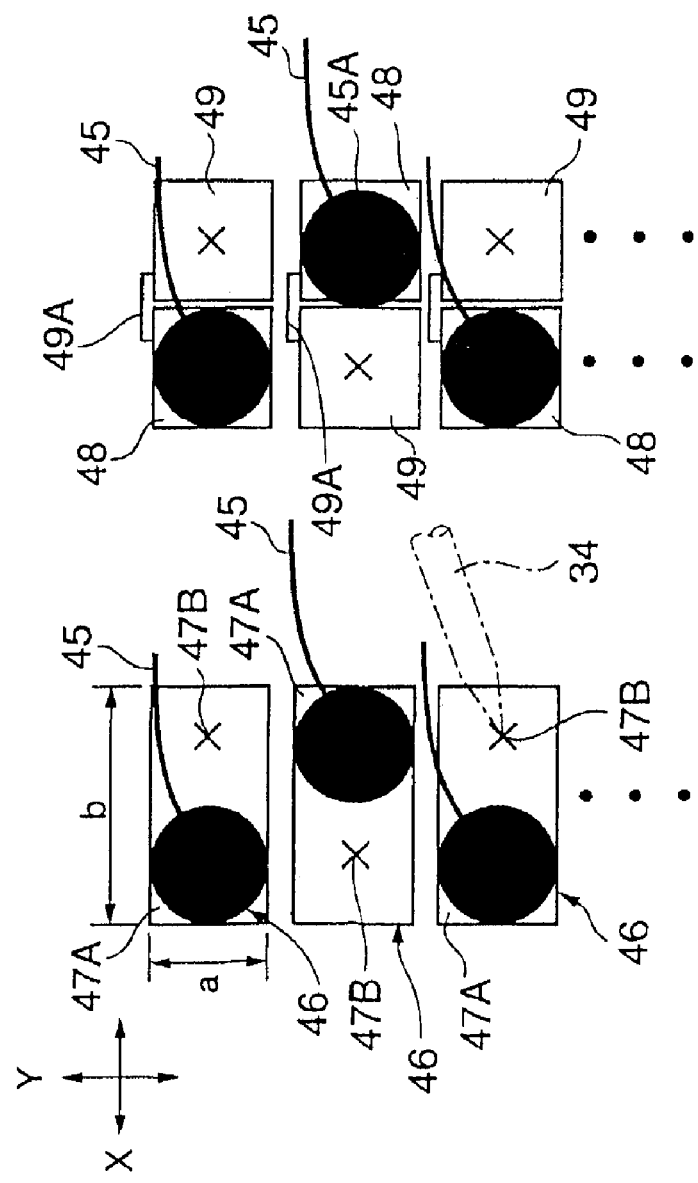

US 6,972,487 B2

MULTI CHIP PACKAGE STRUCTURE HAVING A PLURALITY OF SEMICONDUCTOR CHIPS MOUNTED IN THE SAME PACKAGE

This application is a continuation of international application PCT/JP01/02755 filed on Mar. 30, 2001.

TECHNICAL FIELD

The present invention relates to a semiconductor device, method for manufacturing the semiconductor device and semiconductor substrate, and more particularly, a semiconductor device having an MCP (Multi Chip Package) structure, in which a plurality of semiconductor chips are mounted in the same package, a manufacturing method therefor and a semiconductor substrate used therein.

As electronic equipment and devices have become more compact in recent years, the demand for more compact semiconductor devices and improvements in density continues to increase. As a means of responding to this demand a semiconductor device with an MCP structure, in which a plurality of semiconductor chips are mounted in the same package, has attracted attention.

At the same time, there is a strong desire to reduce the cost of semiconductor devices. In order to achieve that goal, it is necessary to manufacture semiconductor devices with a high rate of yield. Moreover, high reliability is demanded of semiconductor devices as well.

Accordingly, achievement of a semiconductor device capable of satisfying each of the above-described demands is desirable.

BACKGROUND ART

As described above, as electronic equipment has become more compact the demand for more compact semiconductor devices has grown considerably. As a result, semiconductor devices having a CSP (Chip Size Package) structure have come to replace the semiconductor devices having the conventional lead frame as the most common type of device because, by mounting a semiconductor chip atop an interposer, connecting the semiconductor chip and the interposer using a wire bonding method and providing solder balls as external connection terminals beneath the interposer, the CSP structure semiconductor device has greatly reduced the package size as compared to the lead frame type of semiconductor device. Further, CSP, by adopting the MCP structure that stacks a plurality of semiconductor elements in the same package in order to improve actual packaging density, makes it possible to contemplate further miniaturization.

Conventionally, as such a type of semiconductor device, there is that which is disclosed in ① Japanese Laid-Open Patent Application No. 4-7867. In the semiconductor device disclosed in that publication, a plurality of semiconductor chips (for example DRAM) mounted on a portable device and the like is stacked in the same package using MCP technology, as a result of which the size of the packaging area can be reduced.

Additionally, as another conventional semiconductor device, there is that which is disclosed in ② Japanese Laid-Open Patent Application No. 11-145403. The semiconductor device disclosed in that publication is manufactured by the same wafer process in which a plurality of semiconductor function regions having different functions (for example, logic LSI region and DRAM region) are mounted surficially in the same semiconductor device as a single chip, as a result of which the size of the packaging area can be reduced. Additionally, the semiconductor chips are arranged so that different types of semiconductor regions are aligned and a scribe line that demarcates each of the different semiconductor regions is wired, so that each of the different semiconductor regions is electrically connected. Further, the different types of semiconductor regions can be sliced into regional units in any direction on the wafer, either longitudinally or latitudinally, so that by changing the location of the slice in the scribe line the yield can be improved.

Additionally, as another conventional semiconductor device, there is that which is disclosed in ③ Japanese Laid-Open Patent Application No. 11-354714. The semiconductor device disclosed in that publication stacks a plurality of semiconductor chips having different functions in the same package using MCP technology, as a result of which the size of the package area can be reduced.

However, each of the above-described conventional arts had problems like the following:

(a) The semiconductor device of ① is simply a composition in which semiconductor chips (memory chips) having the same function are made into a single chip, so the control LSI for controlling each of these semiconductor chips must be provided externally to and separately from the above-described semiconductor device. As a result, the wiring between the control LSI and the above-described semiconductor device becomes long, causing the control LSI control signal to delay or attenuate.

(b) In the above-described device of ②, the semiconductor regions of different functions are manufactured by the same function, so even if a given process is not necessary to one area formation it may be necessary to conduct such a process for another area formation. In other words, in a case in which, for example, a logic LSI region and a DRAM region are being made into a single package, although a cell formation process may be necessary to the DRAM region such cell formation may not be necessary for the formation of the logic LSI region. Accordingly, compared to a situation in which the logic LSI and the DRAM are formed separately, the throughput of the semiconductor device of ② drops.

Additionally, although the location of the slice on the scribe can be changed longitudinally or latitudinally, nevertheless wiring is formed on that scribe line, so when the line is sliced the sliced portion of the wiring is exposed. Corrosion occurs at this portion and reliability deteriorates.

(C) In the above-described device of ③, when connecting signals between the plurality of semiconductor chips, such connection must once be effected via the lead frame. As a result, signal inductance and capacitance increase and there is a risk that the signal delay or noise will occur. Additionally, such an arrangement also complicates assembly.

At the same time, the reduction packaging area demanded by making portable devices more compact creates the following types of problems for the conventional MCP art and the single-chip technique.

(d) Simply packaging a plurality of semiconductor chips in the same package makes the power of the MCP as a whole the sum of the individual semiconductor chips, so the junction temperature rises and the operating speed slows. If the semiconductor chip is a DRAM, for example, then the data retention time is shortened and, similarly, the breakdown voltage of the transistors formed in the chip deteriorates.

(e) When stacking a plurality of semiconductor chips into a single package, restrictions arise as to the location of the terminals (for example, wire bonding requires that the terminals be positioned at the edges of the chips). As a result, in a case in which an attempt is made to use such a semiconductor chip with a semiconductor device that is different from the MCP structure (such as, for example, a semiconductor device having a lead on chip structure), due to the above-described restrictions on terminal location it can be difficult to mount the chip on the semiconductor device.

(f) For example, in a case in which an attempt is made to achieve a 64 MDRAM on a single chip using two 32 MDRAM semiconductor chips to achieve 64 M of memory capacity, when the process yield is low, the 64 MDRAM yield declines as compared to the 32 MDRAM semiconductor chip yield.

(g) In an MCP, which connects a plurality of semiconductor chips internally, if a signal of one of those semiconductor chips is enclosed only in an interior of the MCP, the information from such semiconductor chip (for example, chip code information and the like of such semiconductor chip) cannot be read out from outside the MCP.

(h) When making a plurality of semiconductor chips into a single package, every semiconductor chip test is executed in a wafer state. As a result, the number of times probes used for testing the terminals of each semiconductor chip are contacted thereto increases, increasing the damage to the terminals. As a consequence, during assembly, even if the wire is bonded to the terminal the strength of that bonding is degraded and thus the reliability of the MCP declines.

(i) When making a plurality of semiconductor chips into a single package, the increase in the number of terminals means that the pitch between terminals narrows. As a result, the possibility of a short between adjacent wires increases during wire bonding, and thus the reliability of the MCP declines.

(j) When stacking a plurality of semiconductor chips, if the chip size of the individual chips differs greatly, then there is a danger that the bonding wire disposed between individual semiconductor chips will become too long, making it impossible to assemble the package. As a result, an area that is wasted is formed on one or another of the stacked semiconductor chips and an adjustment of chip size is carried out, but with such a configuration the cost of the MCP rises.

(k) When making a plurality of semiconductor chips into a single package, the number of signals that can externally control each individual semiconductor chip declines, so it becomes difficult to conduct complex control operations such as test modes and the like. In particular, when a burn in of the MCP is carried out it is necessary to conduct a burn-in test under conditions suited to each individual semiconductor chip, but in order to achieve this it becomes necessary to set test control conditions for each semiconductor chip, further complicating complex control operations such as test modes and the like.

(l) When making a plurality of semiconductor chips into a single package, if a semiconductor chip provided with a laser fuse window is positioned at a lower layer, then when stacking, the laser fuse window is covered over by a semiconductor chip positioned at an upper level. As a result, a gap occurs between the semiconductor chip positioned at the upper level and the laser fuse window, so that, during heating, there is a risk that the air within this space expands and causes cracks, resulting in a reduction in the MCP reliability.

(m) When attempting to manufacture system LSI that incorporate in a single chip memory and logic, logic and memory are produced by different manufacturing processes and the number of steps in the manufacturing process increases, creating drawbacks in terms of productivity as well as costs. Additionally, when attempting to include large-capacity memory in the system LSI, there are the problems that the chip size increases instead of becoming more compact, and at the same time the wafer yield and effective number decrease, leading to an increase in cost. Further, the system LSI, as compared to a stand-alone memory design and a stand-alone logic design, necessitates enormous development time and costs.

DISCLOSURE OF THE INVENTION

The present invention has as its overall object to provide an improved and useful semiconductor device, method for manufacturing the semiconductor device and semiconductor substrate that solve the above-described problems of the conventional art.

A more specific object of the present invention is to achieve a performance improvement, cost reduction and yield improvement in a semiconductor device having an MCP structure in which a plurality of semiconductor chips are stacked in the same package.

In order to achieve these objects, the present invention provides a semiconductor device sealing in one package a first semiconductor chip having a first function and a second semiconductor chip having a second function, the first semiconductor chip having an unsliced scribe line.

According to the above-described invention, the first semiconductor chip has an unsliced scribe line. In other words, the first semiconductor chip is configured so as to combine two functional chips into a single whole. As a result, as compared to a configuration mounting two separated semiconductor chips, the number of dicings (slices) needed to cut out the first semiconductor chip from the wafer can be reduced, thus making it possible to improve the efficiency of the dicing operation and to extend the life of the dicing saw.

Additionally, if two separate functional chips are separately mounted in the same package, then the addition of a second semiconductor chip means it becomes necessary to mount three semiconductor chips in a package. However, according to the above-described invention, the operation is completed with the installation of the two semiconductor chips, so the semiconductor device manufacturing process can be simplified. Further, as compared to a configuration in which three semiconductor chips are stacked, the semiconductor device can be made slimmer.

Additionally, the present invention provides the semiconductor device as described above, wherein the first semiconductor chip and the second semiconductor chip are stacked in the package, and of the first semiconductor chip and the second semiconductor chip, the semiconductor chip with the larger area is disposed at a lower layer with respect to a direction of stacking.

According to the above-described invention, in a stacked state, the terminal formation region of the first semiconductor chip and the terminal region formed on the second semiconductor chip can be securely exposed, and wires and other wiring can be securely connected to the terminal formed on the first semiconductor chip and to the terminal formed on the second semiconductor chip.

Additionally, the present invention provides the semiconductor device as described above, wherein the first function and the second function are different functions.

According to the above-described invention, a high-performance semiconductor device can be developed and manufactured with higher yield, low cost, and further, in a reduced amount of time. In other words, for example considering a case in which the first function is a logic and the second function is a memory, compared to a system LSI in which the logic circuit and the memory circuit are made into one chip, it is possible to develop and manufacture a semiconductor device of equivalent performance at higher yield, lower cost, and further, in reduced time.

Additionally, the present invention provides the semiconductor device as described above, wherein the first semiconductor chip is a memory chip, and further, a first functional chip and a second functional chip formed by the scribe line have an identical configuration.

According to the above-described invention, the first semiconductor chip that is a memory chip is made up of a first functional chip and a second functional chip formed by a scribe line, and the first functional chip and the second functional chip have the same configuration, so for example in a case in which the first semiconductor chip is to have a 64 Mbit storage capacity, the desired storage capacity can be achieved by making the storage capacity of the first and second functional chips 32 Mbits each.

In so doing, compared to a case of manufacturing 64 Mbit semiconductor chips using a low process performance line (such as an old factory line and the like), dicing along the scribe line and manufacturing 32 Mbit semiconductor chips shows improved yield. Additionally, with high process performance lines (such as a new factory line), assembly costs and the like can be reduced by manufacturing without dicing the scribe line. Accordingly, according to the above-described invention, even when manufacturing the semiconductor device in a plurality of factories with different processing strengths, the manufacturing yield of the first semiconductor chip can be improved, thus reducing assembly costs.

Additionally, the present invention provides the semiconductor device as described above, wherein the first semiconductor device is a memory chip and the second semiconductor chip is a logic chip and power wiring and signal wiring are provided between the logic chip and an external connection terminal, only power wiring is provided between the memory chip and the external connection terminal and only signal wiring is provided between the memory chip and the logic chip.

According to the above-described invention, except for the power wiring, all the signal wiring extended from the memory chip is connected to the logic chip. By so doing, the memory chip is controlled directly by the logic chip and not from an external source, and additionally, the length of the signal wires can be shortened, so the operating speed of the memory chip can be increased and, moreover, because the wiring capacity decreases the current consumption can also be reduced.

Additionally, in order to achieve the objects described above, the present invention provides a semiconductor device comprising a support substrate having an external connection terminal, a plurality of semiconductor chips stacked on the support substrate, and a package sealing the plurality of semiconductor chips, wiring being extended from the plurality of semiconductor chips, among the wiring those that are unconnected to the external connection terminal being directly connected between individual semiconductor chips.

According to the above-described invention, by directly connecting between individual semiconductor chips the wiring that is extended from the plurality of semiconductor chips but not connected to the external connection terminals, parasitic inductance and capacitance are reduced as compared to a configuration in which the wiring is connected between individual semiconductor chips via an inter pouser (for example, a lead frame or the like), so the occurrence of signal attenuation and delay in the wiring can be reduced, and moreover, current consumption can be reduced. Additionally, because the need to boost signal output to offset attenuation no longer arises, the junction temperature can be lowered, and as a result, improvements can be contemplated in signal speed and in the breakdown voltage of the transistors formed on the chip.

Additionally, the present invention provides the semiconductor device as described above, wherein of the plurality of semiconductor chips, one of the semiconductor chips is a memory chip and another semiconductor chip is a logic chip stacked on the memory chip and power wiring and signal wiring are provided between the logic chip and an external connection terminal, only power wiring is provided between the memory chip and the external connection terminal, and only signal wiring is provided between the memory chip and the logic chip.

According to the above-described invention, except for the power wiring, all the signal wiring extended from the memory chip is connected to the logic chip. By so doing, the memory chip is controlled directly by the logic chip and not from an external source, and additionally, the length of the signal wires can be shortened, so the operating speed of the memory chip can be increased and, moreover, because the wiring capacity decreases the current consumption can also be reduced.

Additionally, in order to achieve the objects described above, the present invention provides a semiconductor substrate comprising a first functional chip that functions as a semiconductor chip, a second functional chip that functions as a semiconductor chip and is provided adjacent to the first functional chip, and scribe lines that respectively define the first functional chip and the second functional chip, the positioning of the first functional chip and the second functional chip being such that, through selection of the scribe lines for a slicing process, only the first functional chip may be cut out, or only the second functional chip may be cut out, or a region that combines the first functional chip and the second functional chip may be cut out.

According to the above-described invention, by appropriate selection of the scribe line to be sliced, in the case of cutting out just the first functional chip alone, a semiconductor device can be achieved that mounts the first functional chip alone. Similarly, in the case of cutting out just the second functional chip alone, a semiconductor device can be achieved that mounts the second functional chip alone.

Additionally, in the case of cutting out a region that combines the first functional chip and the second functional chip, a semiconductor device can be achieved that mounts the first functional chip and the second functional chip. Further, by taking into account the orientation of each functional chip when cutting out the first functional chip and the second functional chip, a semiconductor device can be achieved that mounts first and second functional chips in different orientations. Thus, by appropriate selection of a scribe line to be sliced, is becomes possible to manufacture semiconductor devices in a variety of embodiments.

Additionally, the present invention provides the semiconductor substrate as described above, wherein wiring that connects adjacent functional chips is not formed where the scribe line is positioned.

According to the above-described invention, wiring is not formed where scribe lines are positioned, so even if the semiconductor substrate is sliced along a scribe line, wiring does not appear in the sliced cross-sectional surface. Accordingly, the humidity resistant properties of the device can be improved and at the same time the occurrence of corrosion in the wiring can be prevented, and the reliability of a semiconductor chip manufactured by slicing the semiconductor substrate can be improved.

Additionally, the present invention provides the semiconductor substrate as described above, wherein a width of a scribe line not to be sliced is narrower than a width of a scribe line to be sliced.

According to the above-described invention, the unsliced scribe line (that is, the scribe line that remains on the semiconductor chip) has a narrowing width, so the formation of so-called dead space can be reduced and the number of functional chips that are formed on a single semiconductor substrate can be increased.

Additionally, in order to achieve the objects described above, the present invention provides a semiconductor device sealing in one package a first semiconductor chip having a first function and a second semiconductor chip having a second function, the first semiconductor chip having an unsliced scribe line, and further, wiring is not provided where the scribe line is positioned.

According to the above-described invention, the first semiconductor chip has a scribe line that is unsliced, so the first semiconductor chip is formed of two functional chips joined to form a single unit. As a result, as compared to a configuration in which two separated semiconductor chips are mounted, the number of dicings (slices) needed to cut out the first semiconductor chip from the wafer can be reduced, thus making it possible to improve the efficiency of the dicing operation and the extend the life of the dicing saw.

Additionally, if two separate functional chips are separately mounted in the same package, then the addition of a second semiconductor chip means it becomes necessary to mount three semiconductor chips in a package. However, according to the above-described invention, the operation is completed with the installation of two semiconductor chips, so the semiconductor device manufacturing process can be simplified.

Additionally, wiring is not formed where the scribe lines are positioned, so even if a scribe line is formed on the first semiconductor chip, the humidity resistance of the first semiconductor chip does not deteriorate and corrosion caused by the scribe line does not occur in the inner wiring.

Additionally, in order to achieve the objects described above, the present invention provides a semiconductor substrate comprising a first functional chip that functions as a semiconductor chip, a second functional chip that functions as a semiconductor chip and is provided adjacent to the first functional chip, and scribe lines that respectively define the first functional chip and the second functional chip, the second functional chip being the first functional chip rotated 180 degrees.

According to the above-described invention, the semiconductor substrate positions the first functional chip and the second functional chip adjacent to each other, and further, the second functional chip is the first functional chip rotated 180 degrees, so when cutting out the first functional chip and the second functional chip from the semiconductor substrate the freedom with which the cutting out can be done is improved.

By so doing, even with low-yield processes that produce malfunctioning chips on the semiconductor substrate, it is possible to avoid the malfunction chips using a multiplicity of pairs of first and second functional chips, so yield can be improved.

Additionally, in order to achieve the objects described above, the present invention provides a semiconductor device comprising a first semiconductor chip, in which a first functional chip and a second functional chip are joined via an unsliced scribe line, and a second semiconductor chip sealed in one package, the second functional chip that forms the first semiconductor chip being the first functional chip rotated 180 degrees.

According to the above-described invention, the second functional chip that makes up the first semiconductor chip is the first functional chip rotated 180 degrees, so orientation can be ignored when mounting the second semiconductor chip. By so doing, when mounting the second semiconductor chip during manufacture of the semiconductor device there is no need to check the orientation of each and every such chip, so assembly can be simplified.

Additionally, in order to achieve the objects described above, the present invention provides a semiconductor device comprising a support substrate having an external connection terminal, a plurality of semiconductor chips stacked on the support substrate, and a package sealing the plurality of semiconductor chips, wiring being extended from the plurality of semiconductor chips, among the wiring those that are unconnected to the external connection terminal being directly connected between individual semiconductor chips, a first electrostatic protection circuit being provided on a terminal of a semiconductor chip connected to the external connection terminal, and either a second electrostatic protection circuit being provided on one terminal of a pair of terminals to which wiring unconnected to the external connection terminal is connected, or the second electrostatic protection circuits being provided on both terminals of the pair of terminals.

According to the above-described invention, by providing the first protection circuit on the terminal of the semiconductor chip connected to the external connection terminal, static electricity can be prevented from damaging the semiconductor chip even if such static electricity enters through the external connection terminal.

Additionally, with respect to the pair of terminals to which wiring is connected, such wiring not being connected to the external connection terminal, a second electrostatic protection circuit to be described later that is smaller than the first electrostatic protection circuit is provided on one of the pair of terminals, or the second electrostatic protection circuit is provided on both of the pair of terminals, so the semiconductor device can be made more compact than is the case with a configuration in which a first electrostatic protection circuit is provided on both. It should be noted that there is no need to provide an electrostatic protection circuit on a terminal that is in no danger of being subjected to an electrical contact from an external source during a test or the like.

Additionally, the present invention provides the semiconductor device as described above, wherein a configuration of the second electrostatic protection circuit provided on the terminal to which wiring not connected to the external connection terminal is connected is smaller than a configuration of the first electrostatic protection circuit provided on the terminal of the semiconductor chip connected to the external connection terminal.

According to the above-described invention, the configuration of the first electrostatic protection circuit that is provided on the terminal of the semiconductor chip connected to an external connection terminal that is expected to receive a large electrostatic charge is enlarged, improving the circuit's protective capacity. By contrast, a small configuration having reduced protective capacity is used for the second electrostatic protection circuit provided on a terminal that is not connected to an external connection terminal, in other words, to which wiring for which no electrostatic charge is expected is connected.

As described above, by selecting the protective capacity of the electrostatic protection circuit according to the strength of the electrostatic charge to be expected, damage to the semiconductor chip from static electricity can be prevented and at the same time the semiconductor chip can be made more compact.

Additionally, in order to achieve the objects described above, the present invention provides a semiconductor device comprising semiconductor chips that are stacked atop each other and that are having a plurality of terminals for sending and receiving information or power to and from outside, the terminals being arranged in at least one row, a first region in which a test probe contacts the terminals and a second region in which wiring that sends and receives information or power to and from the outside is connected to the terminals being provided, the first region and the second region being disposed in a staggered manner in a condition in which the terminals are arranged in the row.

According to the above-described invention, by providing a first region on the terminal that the probe contacts, a second region to which the wiring is connected, and alternating the positions of the first region and the second region, the location at which the test probe contacts the terminal and the location to which the wiring is connected can be made to be different.

Accordingly, even if the number of times the test probe contacts increases and damage to the terminal grows, during assembly the wiring connection (wire bonding) position suffers no damage, so the strength of the wiring connection can be increased. In so doing, the reliability of the semiconductor device can be improved.

Additionally, by arranging the first region and the second region so that they alternate in sequence, the actual separation distance of the second region to which the wiring is connected can be widened. As a result, when providing wiring (wire) to the second region, the occurrence of short circuits between adjacent wires can be prevented.

Additionally, the present invention provides the semiconductor device as described above, wherein the terminal is formed so as to have a first side that extends in a first direction in which they are arranged in the row and a second side that extends in a second direction that is perpendicular to the first direction, the second side being longer than the first side.

According to the above-described invention, because the terminal is shaped so that the side that is perpendicular to the direction in which the line of terminals is arranged in a row is long, the location at which the test probe contacts the terminal and the location at which the wiring is connected can be separated, and at the same time, the pitch between terminals can be narrowed.

Additionally, the present invention provides a method for manufacturing the semiconductor device as described above, comprising a testing step for testing the semiconductor chip by contacting the test probe to the first region, and a wiring step for connecting wiring to the second region after the testing step is completed.

According to the above-described invention, even if the first region sustains damage due to the contact of the test probe during the test step, in the wiring step the wiring is connected to a second region (a region that has not suffered damage) that is different from the first region, so the wiring can be securely connected to the terminal.

Additionally, in order to achieve the object described above, the present invention provides a semiconductor device comprising a first semiconductor chip and a second semiconductor chip, stacked atop a support substrate having an external connection terminal, the first semiconductor chip and the second semiconductor chip sealed in one package, the first semiconductor chip being a memory chip and positioned at a lower layer, and further, the second semiconductor chip being a logic chip and positioned at a layer above the first semiconductor chip.

According to the above-described invention, the second semiconductor chip that is a logic chip is positioned above the first semiconductor chip which is a memory chip, so even if the semiconductor device is exposed to radiation from the outside (alpha rays), because the logic chip exists in the upper layer, the radiation (alpha rays) can be stopped by the logic chip and prevented from reaching the memory chip. As a result, software errors in the memory chip can be prevented from occurring.

Additionally, in order to achieve the above-described invention, the present invention provides a semiconductor device comprising a memory chip and a logic chip stacked atop a support substrate having an external connection terminal, the memory chip and the logic chip sealed in one package, a test terminal for a memory chip test being provided on the memory chip, the test terminal being directly connected to the external connection terminal.

In the ordinary memory chip, during testing (that is, during burn-in and the like) a test logic element for conducting self diagnosis is provided. However, in a configuration which all the memory chip terminals are connected to the logic chip, it is necessary either to drive the test logic element provided on the chip via the logic chip or to provide the test logic element in the logic chip. Such a configuration becomes complicated, the number of steps in the development process increases and the chip size increases.

However, according to the present invention, by directly connecting the test terminal for the memory chip test to the external connection terminal, it becomes possible to test the memory chip directly via the external connection terminal and the test terminal and not via the logic chip. In so doing, an increase in the number of development steps and an increase in the chip size can be prevented, and memory chip testing can be conducted securely.

Additionally, in order to achieve the object described above, the present invention provides a semiconductor device comprising a first and a second semiconductor chips on which an alignment mark is formed for mutual alignment and which are stacked in one package, the alignment mark being formed on a cover film formed on a chip surface.

According to the above-described invention, by forming an alignment mark on a cover film stacked atop the chip surface, the alignment mark can be provided by such simple processes as, for example, forming a concavity or a convexity in the cover film. Accordingly, the alignment mark can be formed easily and cheaply. Additionally, by providing that alignment mark together with a semiconductor chip pad, the chip size can be reduced. The pad to be selected is preferably a test pad that is not bonded, because the surface area of the holes in the cover film due to concavities and the like sometimes shrinks.

Additionally, the present invention provides the semiconductor device as described above, wherein the alignment mark and a semiconductor chip pad are provided jointly.

Additionally, the present invention provides the semiconductor device as described above, wherein the alignment mark and a semiconductor chip pad are provided jointly.

Additionally, the present invention provides the semiconductor device as described above, wherein an alignment mark provided on the first semiconductor chip and an alignment provided on the second semiconductor chip have an identical shape.

According to the above-described invention, each of the alignment marks provided on the first and second semiconductor chips is identical in shape, so the alignment mark recognition accuracy of a recognition device can be improved.

In other words, in a configuration in which a first and second semiconductor chip are stacked on a single package, a disparity occurs in a height of the alignment mark provided on the first semiconductor chip and the alignment mark provided on the second semiconductor chip. Assuming a case in which the shape of the respective alignment marks differs, then any attempt to recognize alignment marks that differ not only in height but also in shape would require the use of a highly accurate recognition device having a deep depth of focus.

By contrast, if the individual alignment marks on the first and second semiconductor chips are given the same shape, then the recognition device only has to be able to recognize the shapes, so even if the depth of focus is slightly off the alignment marks can still be recognized with a high degree of accuracy because the recognition shape signal output from the recognition device is approximated.

Additionally, in order to achieve the objects described above, the present invention provides a semiconductor device comprising a second semiconductor chip stacked atop a first semiconductor chip in one package, a fuse window for redundancy being formed on the first semiconductor chip, the fuse window being positioned at either a position between terminals formed on the first semiconductor chip and terminals formed on the second semiconductor chip, or at a position between an outer periphery of the first semiconductor chip and an outer periphery of the second semiconductor chip where no terminal exists, or at a position outside of a position at which terminals are formed on the first semiconductor chip.

According to the above-described invention, when the second semiconductor chip is stacked atop the first semiconductor chip, the fuse window is formed at a position outside a region in which the first and second semiconductor chips overlap. That is, even if the first and second semiconductor chips overlap, the fuse window will always be in a state of exposure to the outside.

By so doing, the occurrence of cracks when the fuse window is positioned within the region of overlap between the first and second semiconductor chips can be prevented. Additionally, redundancy processes that use the fuse window can also be carried out after the first and second semiconductor chips are stacked. Further, the fuse window can also be filled in with resin or the like after the redundancy processes have been completed, and the entry of water or the like into the interior of the semiconductor device from the fuse window can be prevented.

Additionally, in order to achieve the objects described above, the present invention provides a semiconductor device comprising a plurality of semiconductor chips to be mounted in one package, a cover film being formed at least on such a region of the semiconductor chip positioned at a lower layer as that on which rests the semiconductor chip positioned at an upper layer thereof.

According to the above-described invention, by forming a cover film on a region in which those chips that are positioned at a layer above a semiconductor positioned at a lower layer are stacked, even when the upper layer semiconductor chips are stacked the circuitry formed on the semiconductor chip positioned at the lower layer is protected by the cover film and so suffers no damage.

Additionally, in order to achieve the objects described above, the present invention provides a semiconductor device mounting a memory chip and a logic chip into one package, test signal wiring for the memory chip wired directly between the memory chip and the logic chip, a test auxiliary circuit provided on the logic chip, the test signal being supplied via the auxiliary circuit to an external connection terminal provided on the package.

Normally, on a memory chip, a test logic device is provided by which self-diagnosis is performed on the memory chip at a time of a test (for example, burn-in, or the like). A test signal wiring for the memory chip connected with the test logic device is directly connected to the logic chip. Further, a test auxiliary circuit is provided on the logic chip, and, the test signal is supplied via the auxiliary circuit to an external connection terminal provided on a package.

Thereby, according to the present invention, even in a configuration in which a memory chip and a logic chip are mounted into one package, a test can be performed on the memory chip by using an external connection terminal. At this time, as an auxiliary circuit provided on the logic chip is provide between the external connection terminal and the memory chip, it is possible to perform processing of switching, by using the auxiliary circuit, between a mode in which the external connection terminal and memory chip are connected and a mode in which connection is made to a circuit inside of the logic chip.

Additionally, in order to achieve the objects described above, the present invention provides a semiconductor device stacking so as to mount a plurality of semiconductor chips in one package, a position of terminals that are both provided on a semiconductor chip which is positioned at a lower layer and that are connected to a semiconductor chip positioned at an upper layer being disposed near an outer periphery of the semiconductor chip positioned at the upper layer, logic circuit groups being formed along both sides of a row of terminals formed on the semiconductor chip positioned at the lower layer.

According to the above-described invention, the length of the wiring laid between a semiconductor chip positioned at an upper layer and a semiconductor chip positioned at a lower layer can be shortened, impedance can be reduced and signal speed improved, and current consumption can be reduced. Additionally, by forming logic circuit groups on both sides of the row of terminals formed on the semiconductor chip positioned at the lower level, the formation of so-called dead space on the semiconductor chip can be prevented, so even when the wiring length is shortened the semiconductor device can be made more compact.

Additionally, the present invention provides the semiconductor device as described above, wherein connecting wiring is provided at a position between the pair of adjacent terminals for connecting the logic circuit groups to each other.

According to the above-described invention, by providing connecting wiring that connects the logic circuit groups to each other using a position separate from the pair of adjacent terminals, the connecting wiring that connects the logic circuit groups to each other can be formed at the same time the semiconductor chip positioned at the lower layer is formed, without performing such laborious wiring tasks as wire bonding and the like. Accordingly, the semiconductor device manufacturing process can be simplified and costs reduced.

Additionally, in order to achieve the objects described above, the present invention provides a semiconductor device sealing a first semiconductor chip having a first function and a second semiconductor chip having a second function in one package, the first semiconductor chip being divided into a plurality of functional chips and disposed with open spaces, the second semiconductor chip being stacked above the divided plurality of functional chips.

According to the above-described invention, even if the first semiconductor chip and the second semiconductor chip are the same shape, by dividing the first semiconductor chip into a plurality of functional chips and providing an open space, essentially the mounting surface area of the first semiconductor chip (including the open space) can be made broader than the surface area of the second semiconductor chip. In so doing, even when the second semiconductor chip is mounted on the first semiconductor chip, the terminals of the first semiconductor chip positioned at a lower level can be exposed and connections between individual chips as well as between the chips and the external connection terminal can be effected.

Additionally, the present invention provides the semiconductor device as described above, wherein the first semiconductor device is a memory chip and the second semiconductor chip is a logic chip, and also the memory chip being divided according to storage capacities when the memory chip is divided.

According to the above-described invention, when dividing the memory chip that is the first semiconductor device, the division is made according to storage capacity. That is, for example, if the first semiconductor chip is made to have a storage capacity of 64 Mbits, then the memory chip is divided so that each of the memory chips resulting after division has a storage capacity of 32 Mbits. By so doing, manufacturing the 32 Mbit semiconductor chip results in an improved yield as compared to manufacturing a 64 Mbit semiconductor chip, so the manufacturing yield of the semiconductor device can be improved.

Additionally, the present invention provides the semiconductor device as described above, wherein separation distances of the open spaces are set so as to permit entry of a sealing resin during resin sealing.

According to the above-described invention, open spaces are formed between a plurality of functional chips. As a result, when forming the sealing resin, when gaps are formed in this space there is the danger that cracks and the like may occur as the air in the gap expands during heating during mounting and the like.

However, by making the open space separation distance a distance that enables the sealing resin to penetrate during resin sealing, the open spaces can be filled with sealing resin and the appearance of gaps can be prevented. By so doing, the occurrence of damage such as cracks and the like during heating can be reduced and the reliability of the semiconductor device can be improved.

Additionally, the present invention provides the semiconductor device as described above, wherein a thickness of the first semiconductor chip is greater than a thickness of the second semiconductor chip.

According to the above-described invention, by making the thickness of the second semiconductor chip greater than the thickness of the first semiconductor chip, the height of the open space increases, improving the ability of the sealing resin to fill the open spaces. By so doing, the open spaces can be securely filled with sealing resin, and accordingly, the occurrence of damage such as cracks and the like during heating can be reduced and the reliability of the semiconductor device can be improved.

Additionally, the present invention provides the semiconductor device as described above, wherein a third chip is provided so as to cover the openings at a side of the divided functional chips, and a die bonding material fills a portion surrounded by the divided functional chips and the third chip.

According to the present invention, by providing a third chip beside the divided functional chips, the open space can be surrounded by the chips so as to be closed, and by filling this chip-surrounded portion with die bonding material the open space can be filled with die bonding material.

By filling the open spaces with die bonding material, gaps can be prevented from occurring inside the open space, and accordingly, the occurrence of damage such as cracks and the like during heating can be reduced and the reliability of the semiconductor device can be improved.

Additionally, the present invention provides the semiconductor device as described above, wherein the test signal is normally a signal of a combination of a plurality of control signals to express a command for executing the memory operation mode.

Additionally, the present invention provides the semiconductor device as described above, wherein the test signal is one of either a control signal that deactivates the entire memory, a signal that deactivates a memory input or output terminals, a control signal used during burn-in or a control information signal used in the memory.

Additionally, the present invention provides the semiconductor device as described above, wherein signal wiring for the logic circuit groups is provided on both sides of the row of terminals formed on the semiconductor chip positioned at the lower layer.

Additionally, the present invention provides a semiconductor device comprising a plurality of semiconductor chips having a first function, and a second semiconductor chip having a second function, the first and second semiconductor chips being sealed in one package.

Additionally, the present invention provides the semiconductor device comprising the semiconductor device as described above, wherein the plurality of semiconductor chips having the first function and the second semiconductor chips are stacked in the package.

Additionally, the present invention provides the semiconductor device comprising the semiconductor device as described above, wherein the first function and the second function are different functions.

Additionally, the present invention provides the semiconductor device as described above, wherein the semiconductor chip having the first function is a memory chip and the semiconductor chip is a logic chip, with power wiring and signal wiring being provided between the logic chip and an external connection terminal, only power wiring being provided between the memory chip and the external connection terminal, only signal wiring being provided between the memory chip and the logic chip.

BRIEF DESCRIPTION OF THE DRAWINGS

These and other objects, features and advantages of the present invention will become more apparent from the following detailed description with reference to the accompanying drawings, in which:

FIG. 18A is an enlarged view of a pad provided on a semiconductor device according to a third embodiment of the present invention;

FIG. 18B is an enlarged view of a pad provided on a semiconductor device according to a variation of a third embodiment of the present invention;

FIG. 18C is an enlarged view of a pad of a conventional semiconductor device, for comparison with the pad of the semiconductor device according to the third embodiment;

PREFERRED EMBODIMENTS FOR WORKING THE INVENTION

A description will now be given of embodiments of the present invention, with reference to the drawings.

Figure 1:
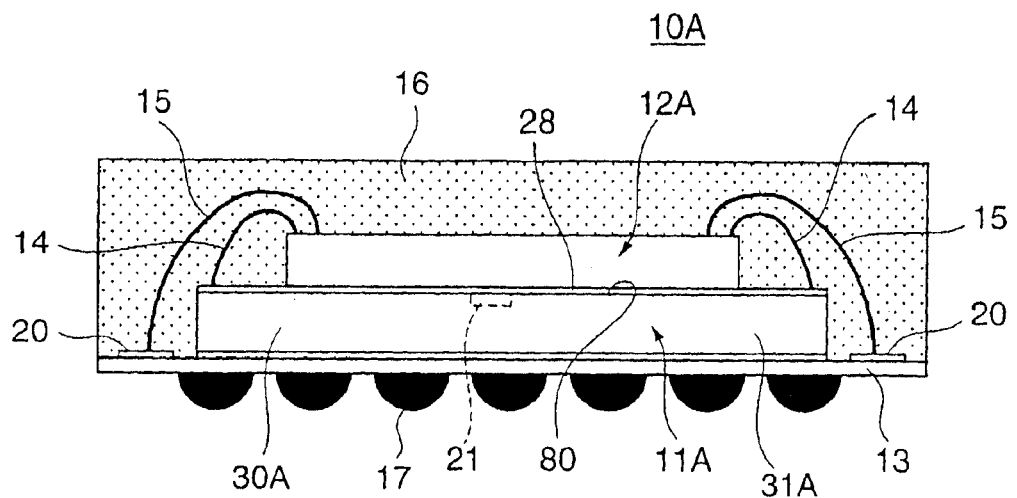
FIG. 1 is a cross-sectional view of a semiconductor device according to a first embodiment of the present invention.
Figure 2:
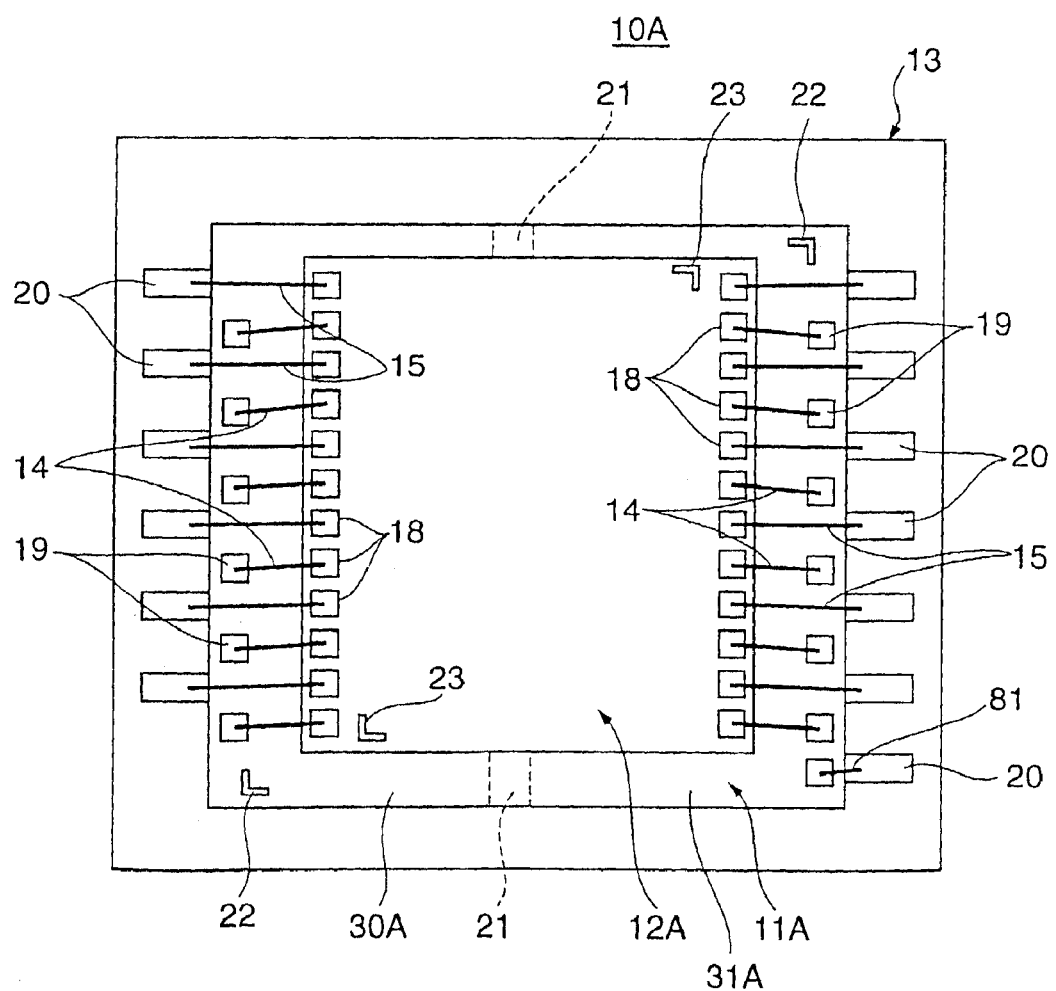
FIG. 2 is a plan view of a semiconductor device according to a first embodiment of the present invention.

FIG. 1 and FIG. 2 show a semiconductor device 10A according to a first embodiment of the present invention. FIG. 1 is a cross-sectional view of the semiconductor device 10A and FIG. 2 is a plan view of the semiconductor device 10A with a resin package 16 removed.

The semiconductor device 10A mainly comprises a first semiconductor chip 11A, a second semiconductor chip 12A, a substrate 13, the resin package 16 and solder balls 17. As shown in each of the drawings, the semiconductor device 10A according to the present embodiment is an MCP—(Multi Chip Package) type semiconductor device, in which the second semiconductor chip 12A is stacked on top of the first semiconductor chip 11A.

First, a description will be given of the first semiconductor chip 11A.

Figure 3:
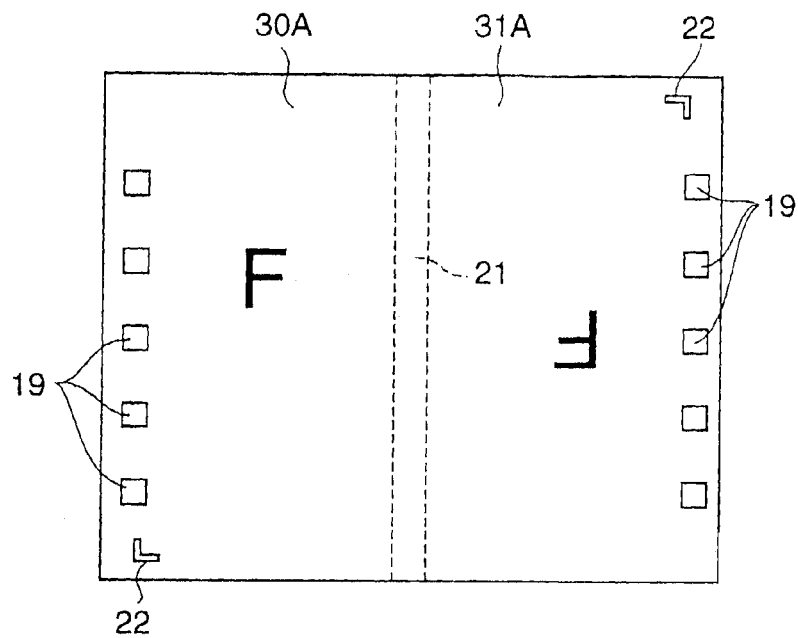
FIG. 3 is a plan view of a first semiconductor chip used in the semiconductor device according to a first embodiment of the present invention.

The first semiconductor chip 11A is a memory chip, and is disposed atop the substrate 13. This first semiconductor chip 11A, as shown in FIG. 3, comprises a first functional chip 30A and a second functional chip 31A disposed so as to sandwich a scribe line 21. Additionally, the first semiconductor chip 11A is configured so that a first pad 19, a first alignment mark 22 and a cover film 28 are provided on a top surface thereof (the surface on which the second semiconductor chip 12A is to be mounted).

Figure 9:
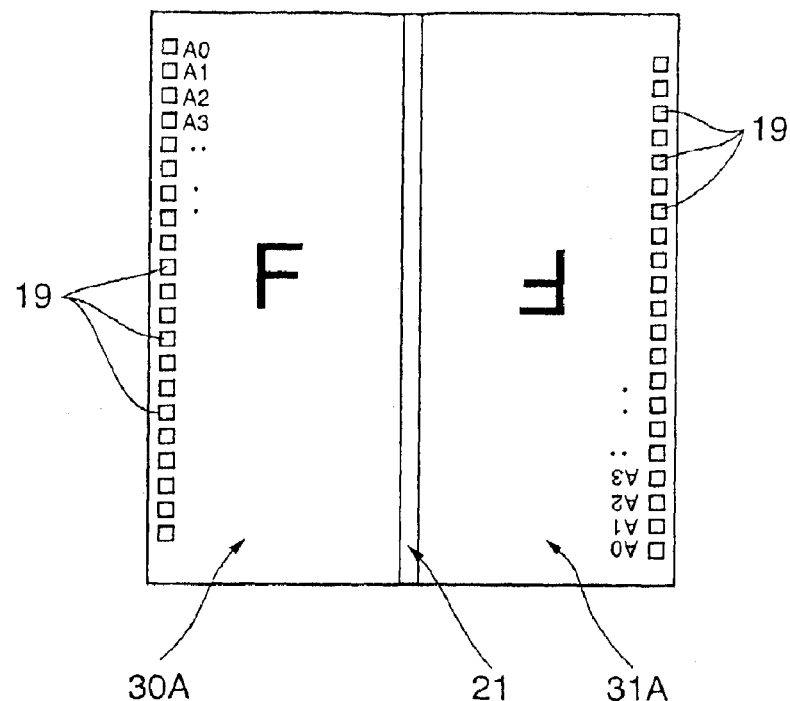
FIG. 9 is a diagram explaining the placement of the first and second functional chips of the first semiconductor chip.

The first and second functional chips 30A, 31A are DRAMs of identical composition, the second functional chip 31A being disposed in a state of being rotated 180 degrees with respect to the first functional chip 30A (see FIG. 9). Additionally, the first and second functional chips 30A, 30B are both configured so as to have 32 Mbits of storage capacity. Therefore, the first semiconductor chip 11A overall is a memory having a large capacity of 64 Mbits (32 Mbits×2).

It should be noted that when attempting to manufacture a semiconductor chip having a large capacity of 64 Mbits, in processually inefficient lines (old factory lines) the wafer yield is poor, and hence it is likely that semiconductor chip manufacturing costs as a whole increase. By contrast, as compared to the 64 Mbit semiconductor chip, the manufacture of semiconductor chips having 32 Mbits of capacity has better wafer yields, and hence manufacturing costs can be reduced.

Accordingly, like the present embodiment, with processually efficient lines (new factory lines), by combining first and second functional chips 30A, 31A having storage capacities of 32 Mbits into 64 Mbit units as a whole, the large-capacity first semiconductor chip 11A can be achieved at low cost.

Figure 6:
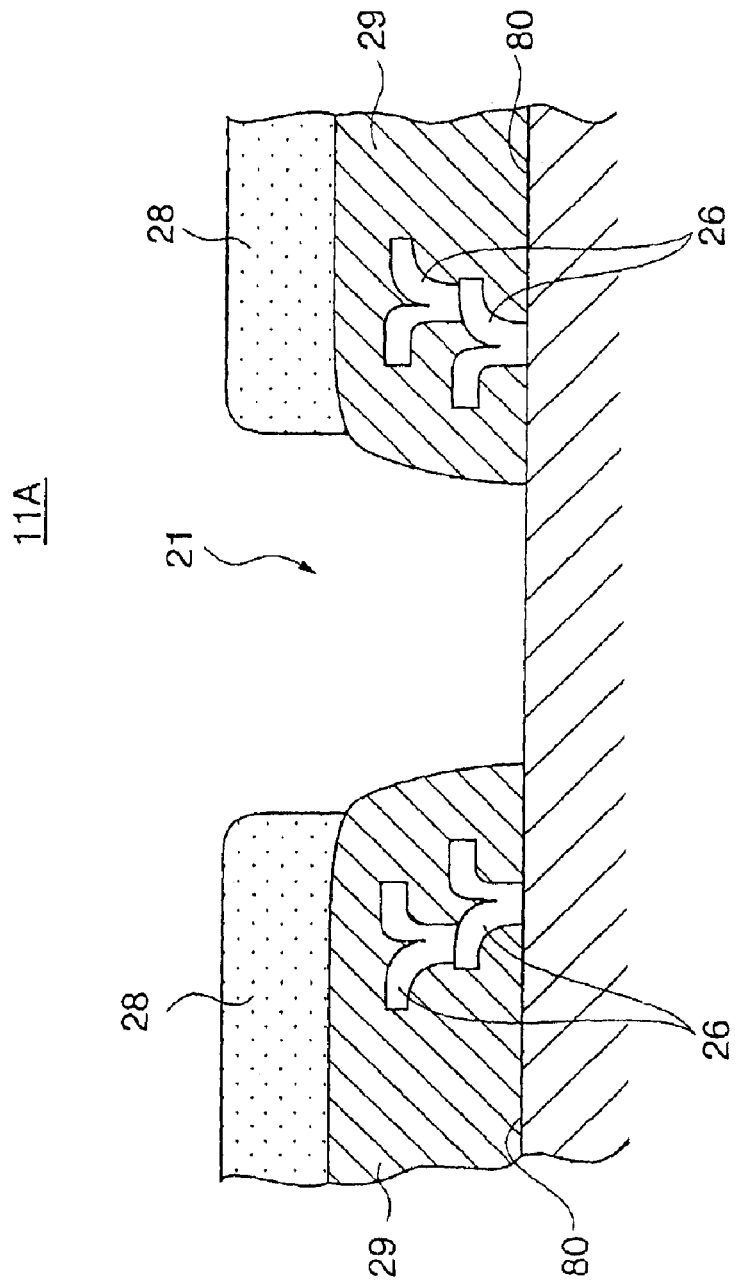
FIG. 6 is an enlarged cross-sectional view of a scribe line.

At the same time, the scribe line 21 formed on the first semiconductor chip 11A, as shown in an enlarged view in FIG. 6, comprises an insulating film 29 formed atop the chip as well as a groove formed in the cover film 28. This scribe line is unsliced, and accordingly the first functional chip 30A and the second functional chip 31A form a single integrated whole.

Additionally, a guard ring 26 is formed at a position in the vicinity of the formation of the scribe line 21 of the insulating film 29. This guard ring 26 performs the function of preventing water and the like from seeping into the interior of the semiconductor chip 11A from the formation position of the scribe line 21.

Additionally, at the formation of the scribe line 21 of the first semiconductor chip 11A, wiring that forms the individual functional chips 30A, 30B is not provided. Accordingly, even if a scribe line is formed in the first semiconductor chip 11A, the wiring and circuitry that form the first semiconductor chip 11A are covered by the insulating film 29 and the cover film 28, and are not exposed to the outside. Therefore, water and the like does not seep into the interior of the semiconductor chip 11A from the scribe line 21, the humidity resistance of the first semiconductor chip 11A can be maintained and the occurrence of corrosion in the internal wiring and circuitry can be prevented.

Additionally, as described above, because the scribe line 21 is not sliced, the first and second functional chips 30A, 31A that form the first semiconductor chip 11A form a single integrated unit. The first and second functional chip 30A, 31A need not always be integrated into a single unit, but a configuration that separates the first and second functional chips 30A, 31A requires that the functional chips 30A, 31A undergo dicing.

By contrast, by using a configuration that separates the first and second functional chips 30A, 31A like the present embodiment, the number of dicings required to cut out the first semiconductor chip 11A (the first and second functional chips 30A, 31A) from the wafer can be reduced, the efficiency of the dicing operation can be improved and the life of the dicing saw can be extended.

Additionally, when the first semiconductor chip 11A is separated into two functional chips, the addition of the second semiconductor chip 12A requires that a total of three semiconductor chips be mounted in the package, which complicates the process of assembling the semiconductor device. By contrast, with the present embodiment the positioning process is completed with two semiconductor chips, so the assembly process for the semiconductor device 10A can be simplified.

It should be noted that in a configuration that separates the first semiconductor chip 11A into two functional chips and forms the semiconductor device out of three semiconductor chips, it is possible to stack these three semiconductor chips in three steps. However, even in a case in which the first semiconductor chip 11A is separated, it is still preferable that the separated functional chips be disposed atop the same planar surface.

At the same time, the first pad 19 is formed in the vicinity of an outer periphery of the first semiconductor chip 11A. Specifically, when the second semiconductor chip 12A is mounted on the first semiconductor chip 11A, it is positioned at an exposed portion. The first pad 19 is connected to the second pad 18 of the semiconductor chip 12A by a second wire 15.

Figure 4:
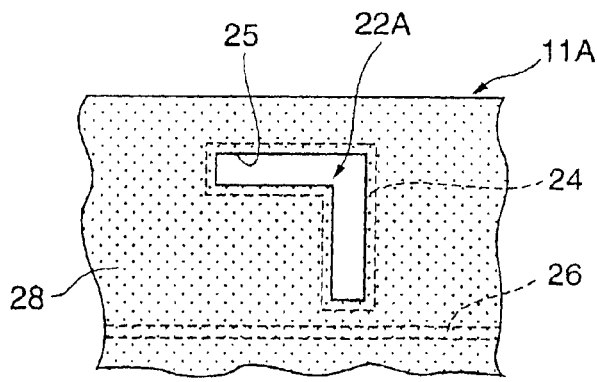
FIG. 4 is an enlarged plan view of an alignment mark.

The first alignment mark 22 is used when stacking the second semiconductor chip 12A on the first semiconductor chip 11A in order to carry out positioning of the chips 11A, 12A. In the present embodiment, by forming an L-shaped opening 25 in the cover film 28 formed on the top surface of the first semiconductor chip 11A as shown in FIG. 4. That is, the first alignment mark 22A is formed in the cover film 28.

The cover film 28 is formed of for example a polyimide or the like, so the L-shaped opening 25 can be easily formed therein by an etching process. Additionally, an opening is formed at the location at which the first pad 19 described above is formed in the cover film 28 in order to make it possible to connect the second wire 15 and the first pad 19.

Accordingly, the L-shaped opening 25 that forms the first alignment mark 22A and the opening formed on the first pad 19 can both be formed at the same time by a single etching process. By so doing, there is no need to carry out a separate etching process in order to form the first alignment mark 22A, so the number of steps in the production process as well as the cost can be reduced.

Additionally, in the present embodiment, in order to improve the identifiability of the first alignment mark 22A, an L-shaped metallic film 24 is provided on a bottom portion of the L-shaped opening 25. This L-shaped metallic film 24 has a metallic luster, so when identifying the first alignment mark 22A by the recognition device (for example a camera) and the like the accuracy of the identification can be improved.

Figure 5A:
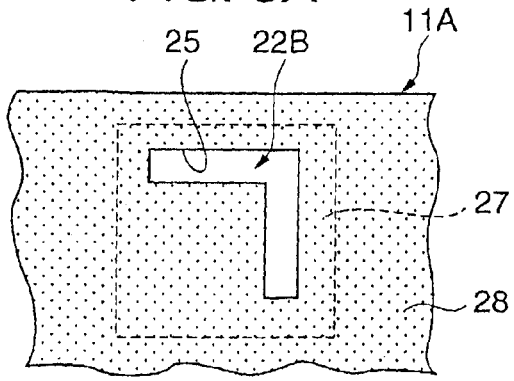
FIG. 5A is an enlarged plan view of an alignment mark.

In the example shown in FIG. 4, the L-shaped metallic film 24 is formed slightly larger than the L-shaped opening 25. In this example, because there is a risk that water and the like may seep into the interior of the first semiconductor chip 11A from the border part between the L-shaped metallic film 24 and the L-shaped opening 25, the guide ring 26 is provided near the location at which the first alignment mark 22A is formed. However, as shown in FIG. 5A, by increasing the surface area of the quadrilateral metallic film 27 with respect to the L-shaped opening 25, the guide ring 26 can be dispensed with.

Figure 5B:
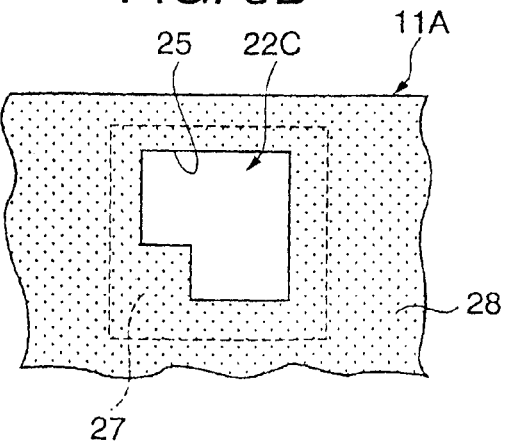
FIG. 5B is an enlarged plan view of an alignment mark.

It should be noted that in the present embodiment the first alignment mark 22A is formed by forming an L-shaped opening 25 in the cover film 28, but it is also possible to create the alignment mark by forming a convexity in the cover film 28. Additionally, by using that alignment mark together with a pad as shown in FIG. 5B it is also possible to reduce the chip size. The alignment mark is sometimes smaller than the surface area of the cover opening, so it is better to use a special test pad that is contacted by the probe, which requires a larger opening than does the bonding wire.

As described above, the cover 28 is formed from a resin such as polyimide or the like having insulation properties. In the present embodiment the cover 28 is formed across the entire top surface of the first semiconductor chip 11A.

Typically, an insulating film of $SiO_2$ or the like is formed on a circuit-forming surface of a semiconductor chip so as to protect the circuit-forming surface. In the first semiconductor chip 11A, too, as shown in FIG. 6, the insulating film 29 is formed on the circuit-forming surface 80. In the present embodiment, the cover film 28 is further formed on top of the insulating film 29.

In a stacked MCP like the present embodiment, because the second semiconductor chip 12A is formed atop the circuit-forming surface 80 of the first semiconductor chip 11A there is a risk that, with protection by just the insulating film 29 alone, the circuit-forming surface 80 might be damaged during mounting. However, by providing a cover film 28, the circuit-forming surface 80 is protected by both the insulating film 29 and the cover film 28, so damage to the circuit-forming surface 80 of the first semiconductor chip 11A can be prevented when the second semiconductor chip 12A is mounted. Accordingly, by providing the cover film 28 the reliability of the semiconductor device 10A can be improved.

It should be noted that, as is clear from the above-described explanation, it is not always necessary that the cover film 28 be formed across the entire surface of the first semiconductor chip 11A. The effect described above can be achieved provided that the cover film is formed on at least that region of the first semiconductor chip 11A positioned at a lower layer on which the second semiconductor chip 12A of an upper layer is stacked.

Next, a description will be given of the second semiconductor chip 12A.

The second semiconductor chip 12A is mounted atop the first semiconductor chip 11A using an adhesive. Additionally, as shown in FIG. 2 the second pad 18 and the second alignment mark 23 are formed on the second semiconductor chip 12A.

This second semiconductor chip 12A is a logic chip. That is, the second semiconductor chip 12A is a semiconductor chip that has a different function from that of the first semiconductor chip 11A described above. Accordingly, in the present embodiment, by providing in a single package a first semiconductor chip 11A having a memory function (first function) and a second semiconductor chip 12A having a logic function (second function) in a single package, the semiconductor device 10A can perform the equivalent function as the system LSI.

However, it is known that the system LSI, which packs a logic circuit as well as a memory circuit in one chip, requires a long time to develop and manufacture and also has a yield that is lower than that of the ordinary semiconductor chip. However, by separating the functions and providing in a single package a first semiconductor chip 11A having a memory function and a second semiconductor chip 12A having a logic function in a single package like the present embodiment, the semiconductor device 10A having high performance can be developed and manufactured at good yield, at low cost, and, further, in a short amount of time.

At the same time, the second pads 18, as will be described in detail later, are connected via the first wire 14 and the second wire 15 to the first pads 19 formed on the semiconductor chip 11A or to third pads 20 formed on the substrate 13. The third pads 20 formed on the substrate 13 are connected to solder balls 17 (which functions as the external connection terminal) formed on a rear surface of the substrate via a through-hole and wiring (not shown in the diagram) formed in the substrate 13. That is, the second semiconductor chip 12A is electrically connected to the solder balls 17 via the second wires 15 and the third pads 20.

Additionally, the second alignment mark 23 is given the same form as the first alignment mark 22 formed on the first semiconductor chip 11A. That is, the second alignment mark 23, as shown previously in FIG. 4 as well as in FIG. 5, has an L-shaped form.

As described above, by giving the first alignment mark 22 formed on the first semiconductor chip 11A and the second alignment mark 23 formed in the second semiconductor chip 12A the same form, the accuracy with which the alignment marks 22, 23 are identified can be improved.

That is, in a configuration in which the second semiconductor chip 12A is stacked atop the first semiconductor chip 11A, inevitably a discrepancy in height occurs between the first alignment mark 22 formed on the first semiconductor chip 11A and the second alignment mark 23 formed on the second semiconductor chip 12A. Specifically, the first alignment mark 22 is positioned at a low position and the second alignment mark 23 is positioned at a high position.

If the shapes of these two alignment marks 22, 23 were to be different, then the recognition device would have to recognize not only a difference in positioning height but also a difference in shape as well. As a result, it would be necessary to use a high-accuracy recognition device with either a deep depth of focus or the ability to automatically adjust the focus, which leads to an increase in costs. Additionally, there is a risk that the recognition device used ordinarily will be unable to recognize the alignment mark, and consequently there is a risk that the positioning of the first semiconductor chip 11A and the second semiconductor chip 12A cannot be performed accurately.

By contrast, as with the present embodiment, by giving the first and second alignment marks 22, 23 provided on the first and second semiconductor chips 11A, 12A, the same shape, the recognition device has only to be able to recognize the shapes, so even if the depth of focus is slightly off the alignment marks can still be recognized with a high degree of accuracy because the recognition shape signal output from the recognition device is approximated. Accordingly, it becomes possible to position the semiconductor chips 11A, 12A to be stacked with a high degree of accuracy and without a consequent increase in equipment costs.

Here, comparing the surface areas of the first semiconductor chip 11A and the second semiconductor chip 12A shows that the surface area of the first semiconductor chip 11A has become greater than the surface area of the second semiconductor chip 12A. That is, atop the first semiconductor chip 11A having a larger surface area is stacked the second semiconductor chip 12A having a smaller surface area.

Accordingly, in a stacked state the first pads 19 formed on the first semiconductor chip 11A can be securely exposed and the first pads 19 and the first wires 14 can be securely connected.

Additionally, as described above, in the present embodiment the first semiconductor chip 11A that is a memory chip and the second semiconductor chip 12A positioned above the first semiconductor chip 11A. Accordingly, even if the semiconductor device 10A is exposed to radiation from the outside (alpha rays), because the second semiconductor chip 12A that is the logic chip is on top the radiation (alpha rays) can be stopped by the metallic wiring and the like that is provided on the second semiconductor chip 12A.

As described above, radiation (alpha rays) can be stopped from reaching the first semiconductor chip 11A that is the memory chip. Accordingly, the occurrence of electrical load loss or inversion in the storage elements formed in the first semiconductor chip 11A that is the memory chip can be prevented and thus so-called software errors can be prevented from occurring.

It should be noted that, in a state in which the second semiconductor chip 12A is stacked atop the first semiconductor chip 11A as shown in FIG. 1, the semiconductor chips 11A, 11B are sealed in the resin package 16. Accordingly, unlike the first semiconductor chip 11A on which the second semiconductor chip 12A is mounted, it is not always necessary to form the cover film 28 on top of the second semiconductor chip 12A. However, in order to form the second alignment mark 23, and also in order to better protect the second semiconductor chip 12A, the cover film 28 may be provided.

Next, a description will be given of the method of laying of the first wire 14 and the second wire 15 among the first semiconductor chip 11A, the second semiconductor chip 12A and the substrate 13.

The wires 14, 15 are connected to the first pads 19 formed on the first semiconductor chip 11A as well as the second pads 18 formed on the second semiconductor chip 12A. At this time, as shown in FIG. 2, in the present embodiment, of the wires 14, 15 extended from the first semiconductor chip 11A as well as the second semiconductor chip 12A, the first wires 14 not connected to the solder balls 17 that are the external connection terminals (that is, are not connected to the third pads 20) are directly connected between the first semiconductor chip 11A and the second semiconductor chip 12A.

Specifically, the second wires 15 that function as power wires as well as the second wires 15 that function as signal wires are provided between the second semiconductor chip 12A that is the logic chip and the third pads 20 connected to the solder balls 17. Additionally, the first wires 14 that function as the signal wires are provided between the first semiconductor chip 11A that is the memory chip and the second semiconductor chip 12A.

Further, in the present embodiment, only a power source wire 81 that supplies power to the first semiconductor chip 11A is provided between the first semiconductor chip 11A and the third pad 20. It should be noted that the supply of power to the first semiconductor chip 11A can also be carried out from the second semiconductor chip 12A. In such a configuration the power wire 81 is connected to the second semiconductor chip 12A.

As described above, in the present embodiment, of the wires extended from the first and second semiconductor chips 11A, 12A, the first wires 14 that are not connected to the third pads 20 (external connection terminal) are connected directly between the semiconductor chips 11A, 12A.

It is possible to effect this connection using a configuration different from the wiring configuration of the present embodiment, in which the wires (wiring) extended from the semiconductor chips are all once connected to an inter pouser or the like (in this case the substrate 13) and then once again extended from the inter pouser to a predetermined semiconductor chip. However, effecting all the wiring connections between the semiconductor chips via the inter pouser lengthens the wires, causing parasitic inductance and capacitance to increase.

However, in the present embodiment, the first wires 14 other than the second wires that are connected to the third pads 20 formed on the substrate 13 are connected not to the substrate 13 (inter pouser) but are connected directly between the individual semiconductor chips 11A, 12A. By so doing, compared to a configuration in which the semiconductor chips are connected via the inter pouser, the wire length can be shortened and thus parasitic inductance and capacitance can be decreased, with the result that the occurrence of signal attenuation and delay in the wiring between chips can be reduced. Additionally, the junction temperature can be lowered because there is no need to increase the signal output in order to compensate for attenuation, and as a result the signal speed can be increased and the breakdown voltage of the transistor formed on the chip can be improved.

However, if static electricity enters the interior of the semiconductor chip from an external source, there is a danger that electrostatic disruption in which the chip-internal circuitry is destroyed might occur. For this reason, generally an electrostatic protection circuit (hereinafter called an ESD circuit) is provided on the semiconductor chip to protect the chip from electrostatic disruption.

Figure 7:
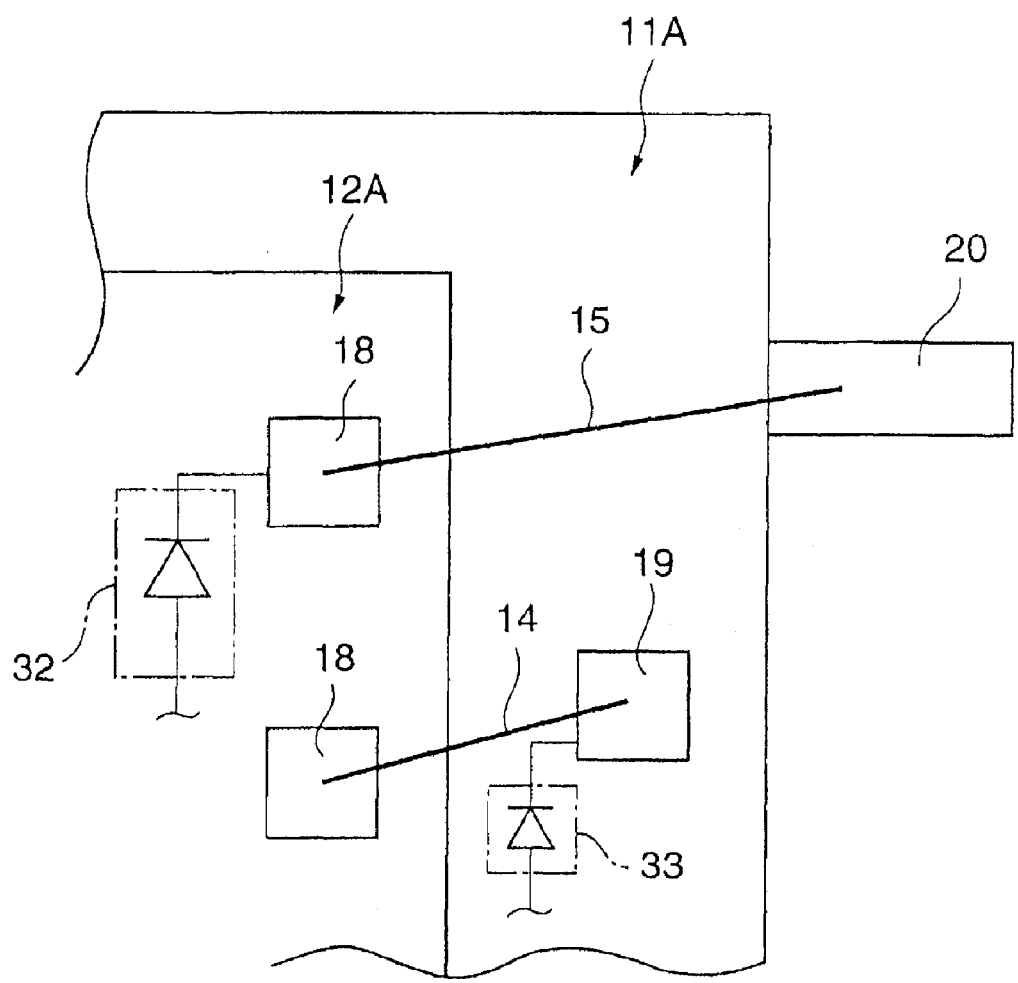
FIG. 7 is diagram showing an electrostatic protection circuit.

As shown in FIG. 7, ESD circuits 32, 33 are provided on the semiconductor chips 11A, 11B mounted in the semiconductor device 10A according to the present embodiment. These ESD circuits 32, 33 for example are composed of diodes connected in reverse of the direction of flow of the static electricity. Accordingly, even if static electricity enters via the solder balls 17, third pads 20 and second wires 15, this static electricity is removed by the ESD 32, so electrostatic disruption of the second semiconductor chip 12A can be prevented.

At the same time, in the present embodiment as described above, of the wires 14, 15 extended from the first and second semiconductor chips 11A, 12A, the first wires 14 that are not connected to the third pad 20 (external connection terminal) are connected directly between the semiconductor chips 11A, 12A. Therefore, as compared to when the second pads 18 that are connected to the third pad 20, there is little possibility that static electricity will enter via the pads 18, 19 that are connected to the first wires 14.

As a result, it may seem that there is no need to provide an ESD circuit on the pads 18, 19 that are connected to the first wires 14. However, when testing the semiconductor chips 11A, 12A, static electricity can enter by the contact of the test probe.

As a result, in the present embodiment, of the pair of pads 18, 19 to which the first wire 14 is connected, the ESD circuit 33 is provided on only one of the pads (in the present embodiment the first pad 19 that is connected to the first semiconductor chip 11A). Through this configuration, as compared to a case in which ESD circuits are provided on both of the pair of pads 18, 19 to which the first wire 14 is connected, the semiconductor device 10A can be made more compact.

That is, the ESD circuit 32 and the ESD circuit 33 are circuits that require a relatively large surface area. Additionally, as more and more pins are added to the semiconductor devices of recent years there is a tendency for the number of pads of the semiconductor chips to increase. If ESD circuits were to be provided on all the pads then the semiconductor chip would have a very large surface area, and accordingly, the semiconductor device also would grow large.

Accordingly, in the present embodiment, the ESD circuit 33 has been provided on only one of the pair of pads 18, 19 not connected externally as described above, and as a result it is possible to both prevent electrostatic disruption and make the device compact. Additionally, the load on the wiring in the circuitry is decreased, so the inductance component also decreases, and, accordingly, input capacity declines, ringing does not occur easily, signal speed can be improved and the noise component can be reduced.

Further, looking at the sizes of the ESD circuit 32 and the ESD circuit 33, compared to the shape of the ESD circuit 32 provided on the second pad 18 that is connected to the third pad (external connection terminal), the shape of the ESD circuit 33 provided on the pad 19 that is not externally connected is smaller.

That is, the ESD circuit 32 is provided on the third pad 20 through which a large amount of static electricity is expected to enter, so the shape is enlarged so as to improve electrostatic protection capacity. By contrast, the ESD circuit 33 is connected to the first pad 19, which is not connected to the third pad 20, in other words to which no large static electric charge will enter, so a small shape with low protective capacity is used.

Thus, by selecting the protective capacity (the shape) of the ESD circuits 32, 33 according to the strength of the static electricity expected to enter, it is possible to both prevent damage to the semiconductor chips 11A, 12A from the static electricity and to make the semiconductor chips 11A, 12A more compact.

It should be noted that by adding a small ESD circuit identical to the ESD circuit 33 of the first semiconductor chip 11A described above to prevent electrostatic disruption during testing of the second semiconductor chip 12A and during wiring assembly, further production yield improvements can be expected. The die size loss of the semiconductor chip 12A at this time is not as large as the ESD circuit 32, and so can be minimized.

However, in the above-described semiconductor device 10A, the unsliced scribe line 21 is formed in the first semiconductor chip 11A, and further, the scribe line 21 is positioned at the bottom of the second semiconductor chip 12A, so when the resin package 16 is formed there is a chance that a gap will form in the scribe line 21.

However, the depth of the scribe line 21 is on the order of several μm (shown in enlarged form in FIG. 6). Additionally, when the second semiconductor chip 12A is stacked atop the first semiconductor chip 11A as described above, an adhesive is introduced between the semiconductor chips 11A, 12A.

Accordingly, the scribe line 21 is filled in by this adhesive, so during formation of the resin package 16 no gap is formed in the scribe line 21. As a result, even if heat treated during mounting, the appearance of cracks in the resin package or the occurrence of separation between the semiconductor chips 11A, 12A can be prevented.

Next, a description will be given of a wafer 35 (semiconductor substrate) on which is formed the first semiconductor chip 11A that is used in the semiconductor device 10A having the structure described above.

Figure 8:
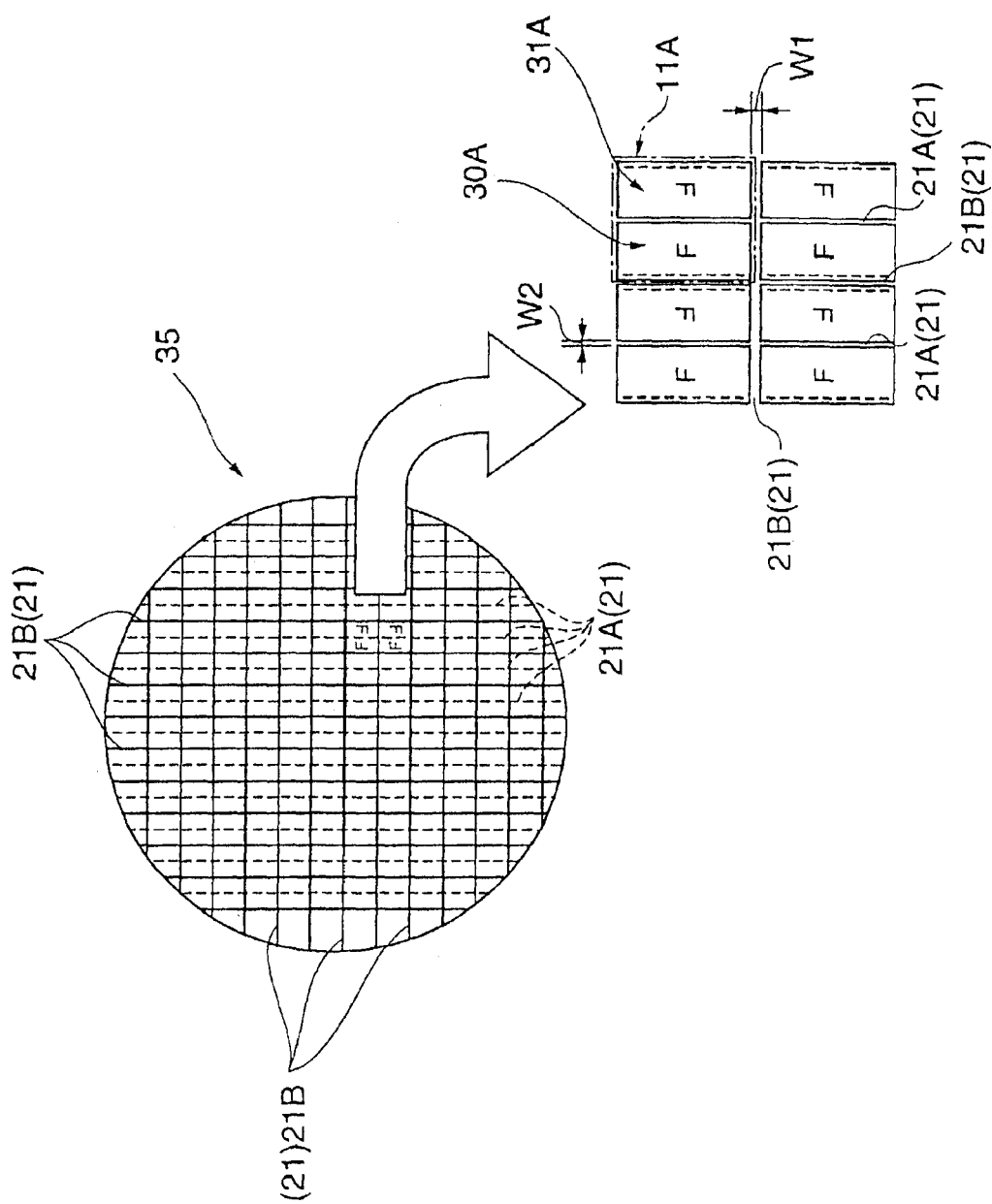
FIG. 8 is a diagram illustrating a method of slicing a first semiconductor chip from a wafer.
Figure 10:
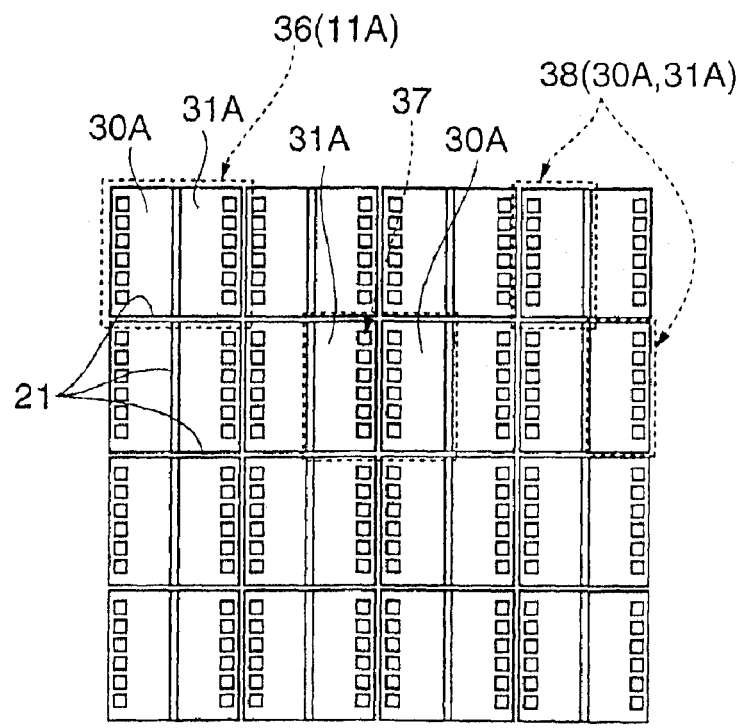
FIG. 10 is a diagram illustrating a method of slicing a first through third embodiment chip.

FIGS. 8 through 10 are diagrams illustrating the wafer 35 on which the first semiconductor chip 11A is formed. As described above, the first semiconductor chip 11A is a combination of the first functional chip 30A and the second functional chip 31A. As a result, as shown in FIG. 8, a plurality of first functional chips 30A and second functional chips 31A are formed on the wafer 35 by the scribe line 21.

Additionally, as described above, the first semiconductor chip 11A has an unsliced scribe line, so the wafer 35 has unsliced scribe lines (indicated by reference numeral 21A) and actually sliced scribe lines (indicated by reference numeral 21B).

In the chip layout of the same diagram, the scribe lines that extend horizontally are all sliced scribe lines 21B. Additionally, the scribe lines that extend vertically alternate between unsliced scribe lines 21A and sliced scribe lines 21B.

Examining the width of the unsliced scribe lines 21A and the sliced scribe lines 21B, as shown in FIG. 8 a width W2 of the unsliced scribe lines 21A is narrower than a width of the sliced scribe lines 21B (W1>W2).

By narrowing the width W2 of the unsliced scribe lines 21A (that is, the scribe lines that remain on the first semiconductor chip 11A) as described above, the formation of so-called dead space on the wafer 35 can be reduced. Accordingly, the number of first and second functional chips 30A, 31A formed on a single wafer can be increased, and the manufacturing efficiency of the first semiconductor chip 11A (functional chips 30A, 31A) can be improved.

Additionally, as described above, with respect to the placement of the adjacent pair of functional chips 30A, 31A that make up the first semiconductor chip 11A, as shown in FIG. 8 and FIG. 9 the second functional chip 31A is rotated 180 degrees with respect to the first functional chip 30A. That is, the layout of the pads 19 of the second functional chip 31A also is rotated 180 degrees with respect to the layout of the pads 19 of the first functional chip 30A (see FIG. 9).

By so doing, even with the rotation of the first semiconductor chip 11A (the first and second functional chips joined) 180 degrees, the layout of the pads before rotation and after rotation is the same. Accordingly, orientation can be ignored when positioning the first semiconductor chip 11A on the substrate 13. As a result, during manufacture of the semiconductor device 10A there is no need to check the orientation of the first semiconductor chip 11A and therefore the assembly process can be simplified.

It should be noted that as a method of forming the functional chips 30A, 31A rotated 180 degrees on the wafer 35, a 32 Mbit reticle can be produced and the functional chips 30A, 31A can be formed by rotating this reticle 180 degrees during exposure. Or, a reticle that corresponds to the pair of functional chips 30A, 31A can be produced and used to expose the functional chips 30A, 31A all at once.

On the other hand, with the wafer 35 of the present embodiment, by appropriate selection of the scribe lines 21 (21A, 21B) to be sliced, the following four different ways of cutting out become possible, that is ① cutting out only the first functional chip 30A alone, ② cutting out only the second functional chip 31A alone, ③ cutting out a combination of the first and second functional chips 30A, 31A, with the first pads 19 positioned at an outer side, and ④ cutting out a combination of the first and second functional chips 30A, 31A, with the first pads 19 positioned at a center. In this case, the scribe lines 21A have the same width as the scribe lines 21B.

It should be noted that, as described above, the first functional chip 30A and the second functional chip 31A are rotated 180 degrees relative to each other, so the semiconductor chips cut out using embodiments ① and ② described above have the same configuration.

In FIG. 10, a first embodiment chip 36 is a semiconductor chip manufactured using the cut-out method ③ described above. The first embodiment chip 36 is the same thing as the first semiconductor chip 11A described above. Additionally, as shown in FIG. 10, a second embodiment chip 37 is a semiconductor chip manufactured using the cut-out embodiment ④ described above. Further, as shown in FIG. 10, a third embodiment chip 38 is a semiconductor chip manufactured using the cut-out embodiments either ① or ② described above.

Figure 11:
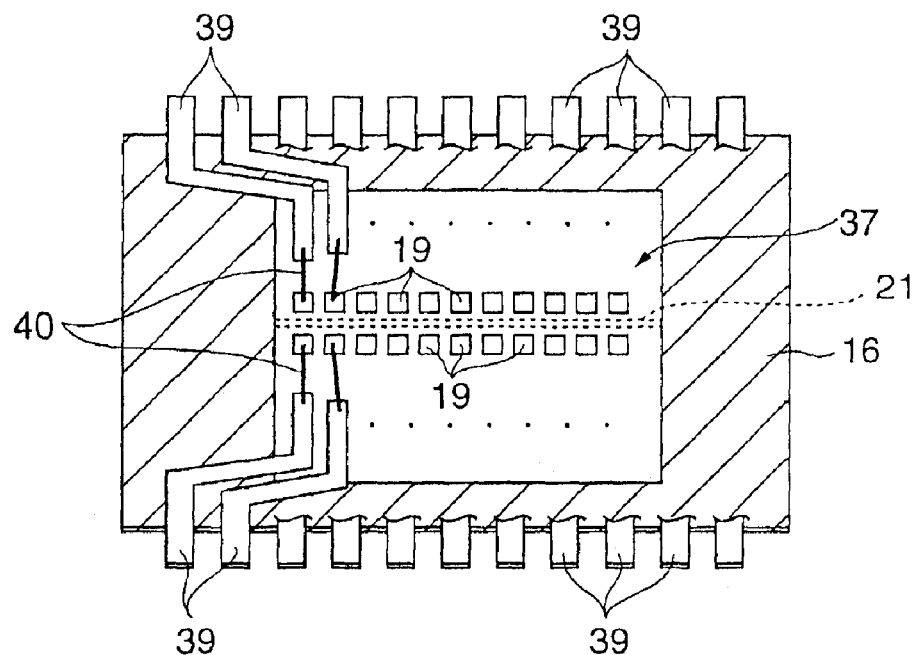
FIG. 11 is a cross-sectional view of one example of a semiconductor device using a chip of a second embodiment.

FIG. 11 shows a semiconductor device 10B that uses the second embodiment chip 37. As shown in FIG. 11, the second embodiment chip 37 is configured so that the pads 19 are positioned in the center, so leads 39 are extended to a top portion of the second embodiment chip 37 and connected by wires 40. The semiconductor device 10B of this configuration is a so-called Lead On Chip (LOC) type of semiconductor device. It should be noted that with this semiconductor device 10B also, unsliced scribe lines 21 exist in a center of the second embodiment chip 37.

Figure 12:
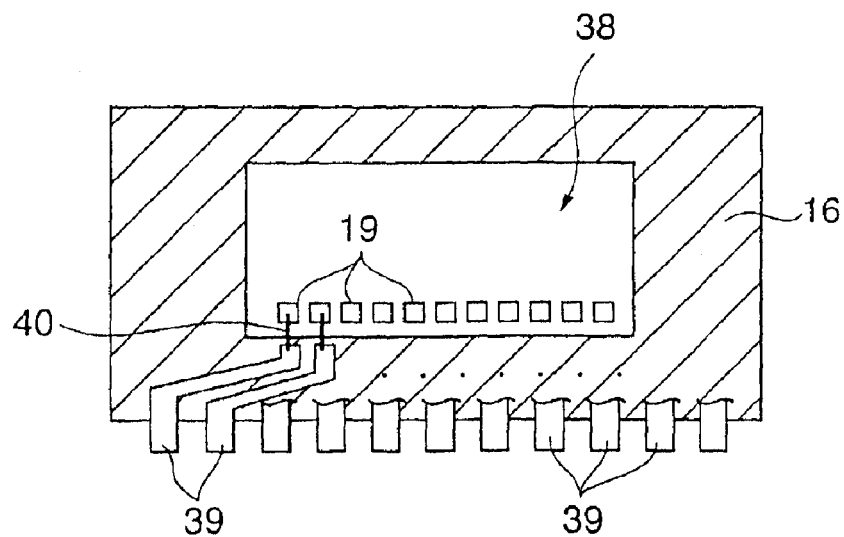
FIG. 12 is a cross-sectional view of one example of a semiconductor device using a chip of a third embodiment.

Additionally, FIG. 12 shows a semiconductor device 10C using the third embodiment chip 38. Leads 39 are provided on only one side of the semiconductor device 10C because the pads 19 are provided on only one side of the chip, the leads 39 being connected to the pads 19 via wires 40. This semiconductor device 10C is a so-called Single Inline Package (SIP) type of semiconductor device. By appropriately selecting the scribe lines 21 to be sliced as described above, it becomes possible to manufacture a variety of embodiments of semiconductor devices 10A, 10B, 10C.

Additionally, the wafer 35 according to the present embodiment is configured so that wiring that connects adjacent functional chips 31A, 31B to each other is not formed where scribe lines 21 (including unsliced scribe lines 21A as well as sliced scribe lines 21B) are positioned. With such a configuration, no matter along which of the scribe lines 21 the semiconductor substrate 35 is sliced, the wiring does not appear in the sliced surface. Accordingly, the humidity-resistant and corrosion-resistant properties of the separated and individualized semiconductor chips 36 (11A), 37, 38 are enhanced and reliability can be improved.

Next, a description will be given of a second embodiment of the present invention.

Figure 13:
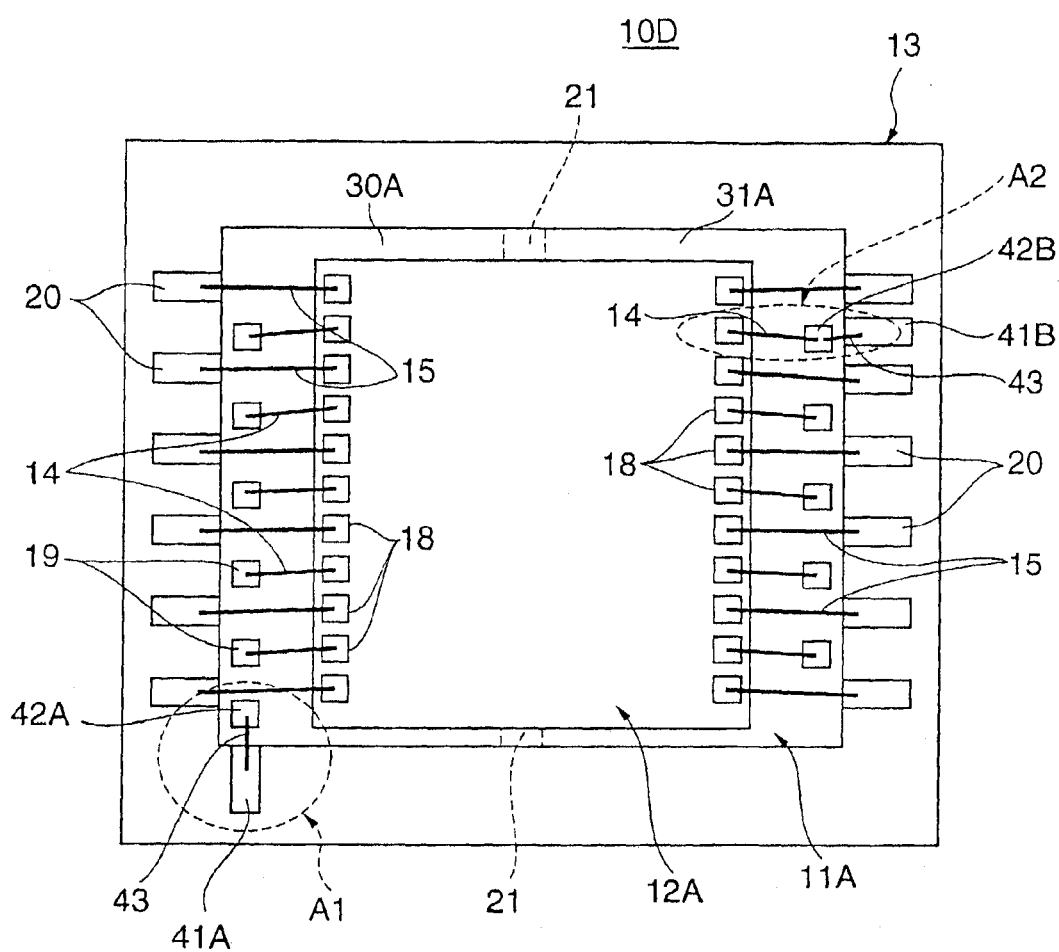
FIG. 13 is a plan view of a semiconductor device according to a second embodiment of the present invention.

FIG. 13 is a plan view of a state in which the resin package 16 has been removed from a semiconductor device 10D according to a second embodiment of the present invention. It should be noted that, in FIG. 13, elements which are identical to or which correspond to elements of the semiconductor device 10A according to the first embodiment of the present invention described previously using FIGS. 1 through 12 are given the same reference numbers and a description thereof is omitted. Additionally, the same holds true for descriptions of the third and all subsequent embodiments.

The semiconductor device 10D according to the present embodiment is characterized by providing a test terminal for memory chip testing (hereinafter called an information output pad 42A) on the first semiconductor chip 11A that is a memory chip, with the information output pad 42A being directly connected to a test electrode 41A formed on the substrate 13 (refer to the portion indicated by arrow A1 in the diagram). The test electrode 41A and the information output pad 42A are connected by a wire 43. Additionally, the test electrode 41A is connected to the solder ball 17 provided on the substrate 13.

However, a test logic element for conducting self diagnosis during testing (for example, during burn in) is provided on the ordinary memory chip. Additionally, a lot code that records the manufacturing history of the chip, a wafer code, and a chip code for identifying the chip (hereinafter these codes as a whole being referred to as recording codes) are recorded in the chip.

However, in a configuration such as that of the present invention, in which all the first pads 19 provided on the first semiconductor chip 11A that is the memory chip are connected to the second semiconductor chip 12A that is the logic chip (with the exception of the power source, as described above), it is necessary either to drive the test logic element provided on the first semiconductor chip 11A via the second semiconductor chip 12A or to drive the test logic element by the second semiconductor chip 12A. Additionally, when reading out the recording code as well, the read-out must be via the second semiconductor chip 12A.

With such a configuration, in which the second semiconductor chip 12A is used for the first semiconductor chip 11A testing or the read-out of the recording code, the configuration of the second semiconductor chip 12A that is the logic chip becomes complicated and, at the same time, the number of steps in the development process increases and further, the second semiconductor chip 12A chip size increases. Additionally, the recording code test process becomes laborious.

By contrast, with the semiconductor device 10D according to the present embodiment, as described above an information output pad 42A is provided on the first semiconductor chip 11A and this information output pad 42A is connected to the solder ball 17 via the wire 43 and the test electrode 41A. With such a configuration, it becomes possible to conduct tests of the first semiconductor chip 11A directly using the solder ball 17, without going through the second semiconductor chip 12A. Additionally and similarly, it becomes possible to read the recording codes without going through the second semiconductor chip 12A, thereby simplifying the process of reading out the recording codes.

Further, because the circuitry design of the second semiconductor chip 12A is not limited by the first semiconductor chip 11A it is possible to reduce the number of development steps. Additionally, because it is no longer necessary to provide a test circuit for the first semiconductor chip 11A, the second semiconductor chip 12A can be made more compact. Further, when testing the semiconductor device 10D, it is possible to test the first semiconductor chip 11A and the second semiconductor chip 12A in parallel at the same time, so testing efficiency can be improved.

Next a description will be given of a third embodiment of the present invention.

Figure 14:
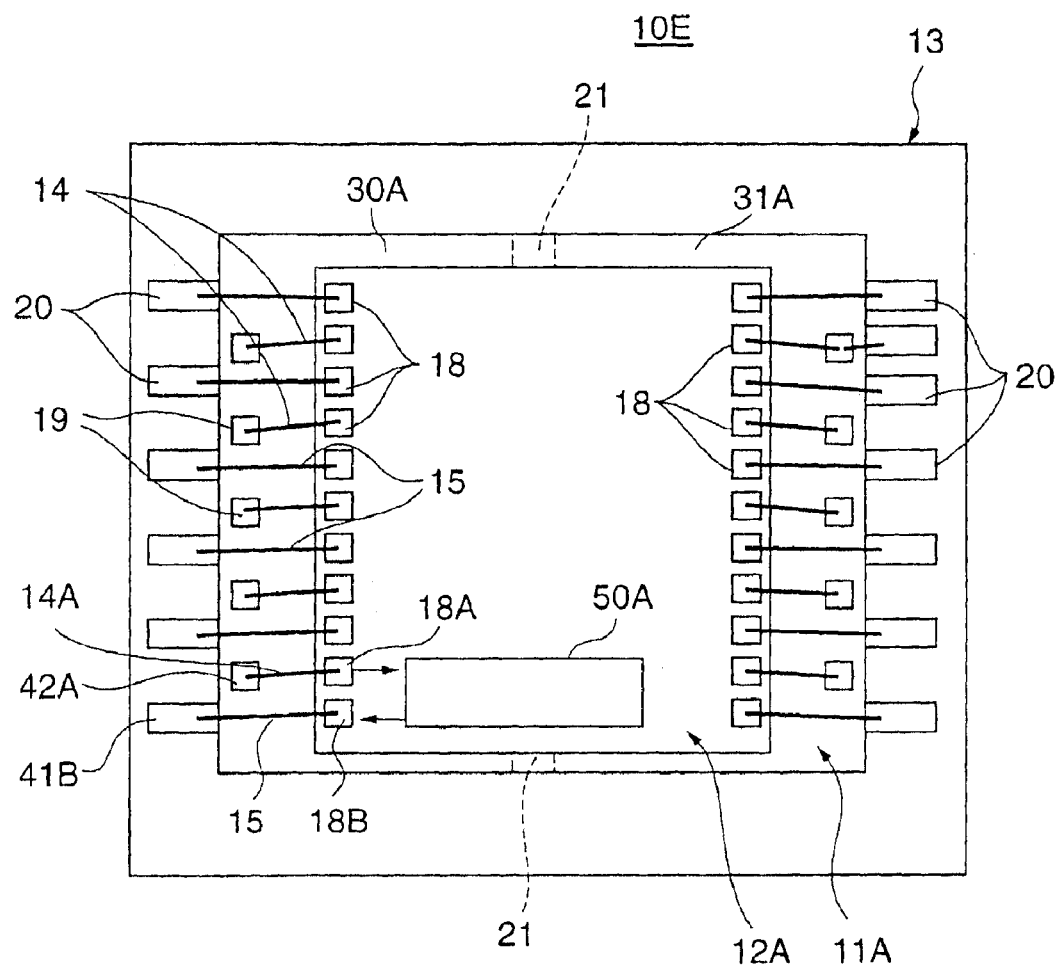
FIG. 14 is a plan view of a semiconductor device according to a third embodiment of the present invention.

FIG. 14 is a plan view of a state in which the resin package 16 has been removed from a semiconductor device 10E according to a third embodiment of the present invention.

As described above, the semiconductor device 10D according to the second embodiment drives a test logic terminal of the first semiconductor chip 11A not via the second semiconductor chip 12A, and also can read out the recording codes.

By contrast, the semiconductor device 10E according to the present invention is characterized by directly laying test signal wiring (hereinafter called test wiring 14A) for the first semiconductor chip 11A that is the memory chip between the first semiconductor chip 11A and the second semiconductor chip 12A, and at the same time providing a spare test circuit on the second semiconductor chip 12A (hereinafter called information transmission circuit 50A).

That is, as with the second embodiment, the first semiconductor chip 11A is provided with a test logic circuit which is driven and also an information output pad 42A for reading out recorded recording codes. This information output pad 42A is connected to a second pad 18A of the second semiconductor chip 12A via the test wiring 14A. Additionally, this second pad 18A is connected to the information transmission circuit 50A.

At the same time, the information transmission circuit 50A is connected to the test electrode 41B via the second pad 18B as well as the second wire 15. This test electrode 41B is connected to the solder ball 17 provided on the substrate 13. Accordingly, the information output pad 42A is connected to the solder ball 17 (external connection terminal) via the information transmission circuit 50A.

Accordingly, with the semiconductor device 10E according to the present embodiment as well, it is possible to conduct tests of the first semiconductor chip 11A directly using the solder balls 17 (external connection terminal) connected to the test electrode 41B. Additionally and similarly, it is also possible to read out recording codes recorded in the first semiconductor chip 11A from the solder ball 17, and so the process of reading out the recording codes can be accomplished easily.

Figure 15:
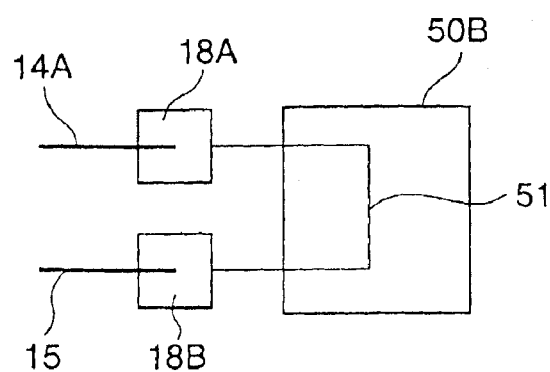
FIG. 15 is a diagram showing one example of an information transmission circuit provided on a semiconductor device according to a third embodiment of the present invention.

FIG. 15 is a diagram showing an information transmission circuit 50B capable of being provided on the second semiconductor chip 12A. As shown in the diagram, the information transmission circuit 50B need not necessarily be a circuit configuration, and can instead comprise simply a connecting wire 51 that connects the second pad 18A and the second pad 18B.

Figure 16A:
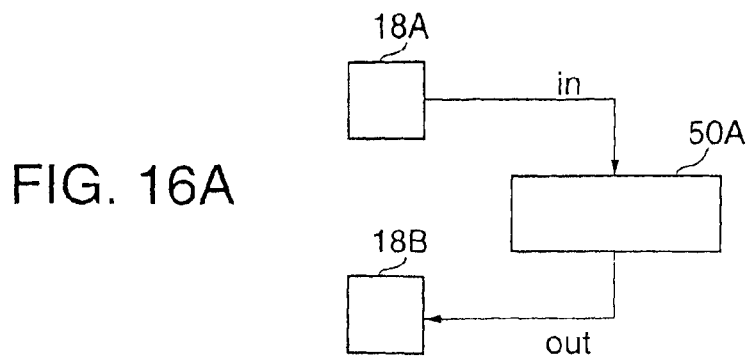
FIG. 16A is a diagram showing one example of an information transmission circuit provided on a semiconductor device according to a third embodiment of the present invention.
Figure 16B:
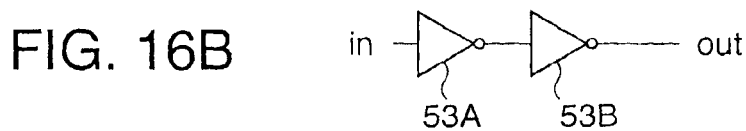
FIG. 16B is a diagram of the circuit structure of the information transmission circuit shown in FIG. 16A.

Additionally, FIG. 16A and FIG. 16B show an information transmission circuit 50A positioned in the semiconductor device 10E shown in FIG. 14. In the present embodiment the information transmission circuit 50A is formed by two inverters 53A, 53B.

However, in the configuration shown in FIGS. 16A and 16B, the second pad 18B becomes a pad strictly for testing and for recording code read-out of the first semiconductor chip 11A. These testing and recording read-out processes are normally not used once the semiconductor device 10E has been mounted, so it is undesirable to provide this type of special pad on the second semiconductor chip 12A solely for testing and recording code read-out.

Figure 17A:
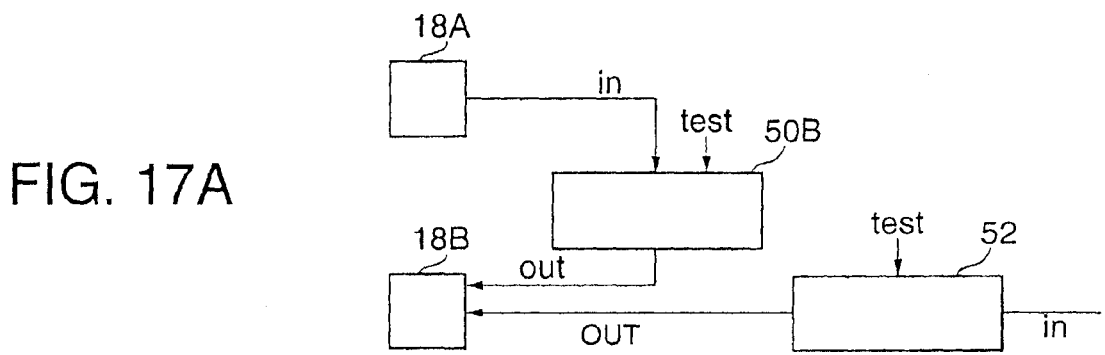
FIG. 17A is a diagram showing another example of an information transmission circuit provided on a semiconductor device according to a third embodiment of the present invention.
Figure 17B:
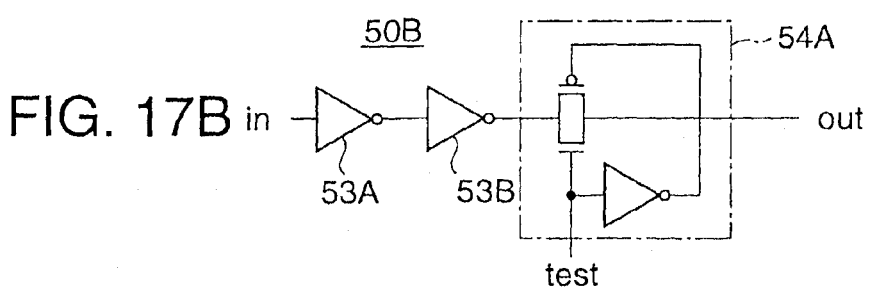
FIG. 17B is a diagram of the circuit structure of the information transmission circuit shown in FIG. 17A.
Figure 17C:
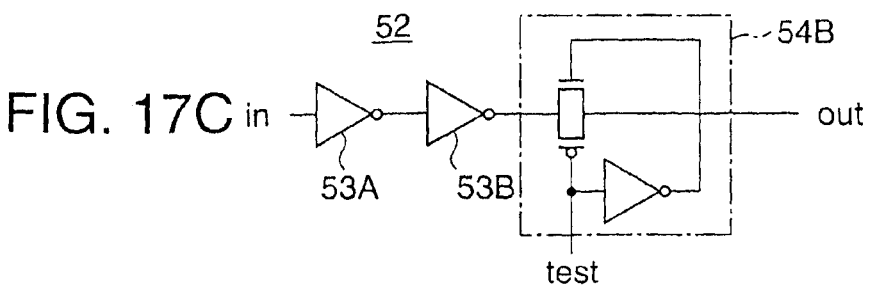
FIG. 17C is a diagram of the circuit structure of the information transmission circuit shown in FIG. 17A.

Accordingly, by providing a switching function on the auxiliary circuit, the second pad 18 and the information output pad 42A are connected during testing and recording code readout, and in all other cases the second pad 18B can be connected to a normal operation circuit 52 of the second semiconductor chip 12A. FIGS. 17A through 17C show such embodiments.

As shown in FIG. 17A, in the present embodiment, in addition to the information transmission circuit 50B the normal operation circuit 52 is connected to the second pad 18B. FIG. 17B shows one example of the circuit configuration of the information transmission circuit 50B, and FIG. 17C shows one example of the circuit configuration of the normal operation circuit 52.

As shown in FIG. 17B, the information transmission circuit 50B comprises two inverters 53A, 53B and a switching circuit 54A. This switching circuit 54A switches by outputting a signal input (in) by a test signal (test) input during testing and recording code read-out. Conversely, when the test signal (test) input stops, the input (in) signal is cut off and there is no output. It should be noted that the signal input (in) to the information transmission circuit 50B is a signal from the information output pad 42A of the first semiconductor chip 11A.

Additionally, as shown in FIG. 17C, the normal operation circuit 52 comprises two inverters 53A, 53B and a switching circuit 54B. This switching circuit 54B switches by cutting off a signal input (in) by the test signal (test) input during testing and recording code read-out. Conversely, when the test signal (test) input stops, the input signal (in) is output (out).

It should be noted that the signal input (in) to the information transmission circuit 52 is a signal from the internal circuitry of the second semiconductor chip 12A. Additionally, the above-described test signal is one of either a signal that is ordinarily a combination of control signals and that expresses a command by which a memory operation mode is executed, a control signal that deactivates the entire memory, a signal that deactivates a memory input and output terminal, a burn-in control signal or a memory-internal control information signal.

By adopting the above-described configuration, the second pad 18B can be used during both testing and recording code read-out as well as during other ordinary operations. As a result, the number of pads to be provided on the second semiconductor chip 12A can be reduced and the second semiconductor chip 12A can be made more compact.

Next, a description will be given of a fourth embodiment of the present invention.

FIG. 18A is a diagram showing an enlarged view of pads formed on semiconductor chips provided in a semiconductor device that is a fourth embodiment of the present invention. In the fourth embodiment it is the pads that are distinctive, with the rest of the embodiment unchanged from the semiconductor devices 10A, 10D and 10E according to the first through third embodiments already described, and hence an explanation of the elements of the fourth embodiment other than the pads shall be omitted.

In the above-described embodiments, the shapes of the first pad 19 and the second pad 18 are substantially square, and aligned in a row (see FIG. 18C. By contrast, in the present embodiment the pads 46 are oblong in shape (hereinafter called oblong-shaped pads 46), which are aligned in a row.

Specifically, the oblong-shaped pads 46 comprise a first side that extends in a first direction of alignment in a row (the direction of arrow X in the diagram) as well as a second side that extends in a second direction that is perpendicular to the above-described first direction (the direction of arrow Y in the diagram), with a length of the second side b being greater than a length of the first side a (a<b). The surface area of these oblong-shaped pads 26 is approximately twice that of the pads 18, 19 provided on the semiconductor devices 10A, 10D, 10E according to the first through third embodiments described above.

By making the pads oblong shaped as described above, it is possible to make a first region that a test probe 34 contacts in the oblong-shaped pad 46 (hereinafter called probe contacting portion 47B) different from a second region to which the wire 45 is connected (hereinafter called bonding portion 47A). Additionally, a bonding portion 47A is provided between adjacent oblong-shaped pads 46 so as to alternate, and as a result the probe contacting portions 47B also alternate as well.

Accordingly, the bonding portions 47A and the probe contacting portions 47B are disposed so as to be arranged in an alternating sequence and can thus be separated on the oblong-shaped pads 46 the bonding portions 47A to which wires 45 are connected from the probe contacting portions 47B that the test probes contact, and further, the pitch between oblong-shaped pads 46 can be narrowed. Additionally, the actual separation distance between the bonding portions 47A to which the wires 45 are connected can be widened, so the occurrence of between adjacent wires 45 during wiring of the bonding portions 47A with the wires 45 can be prevented.

However, in a semiconductor device that stacks the second semiconductor chip 12A atop the first semiconductor chip 11A as the present invention does, the number of times the test probe 35 contacts the oblong-shaped pads 46 during testing increases. A description thereof follows, with reference to FIG. 19.

Figure 19:
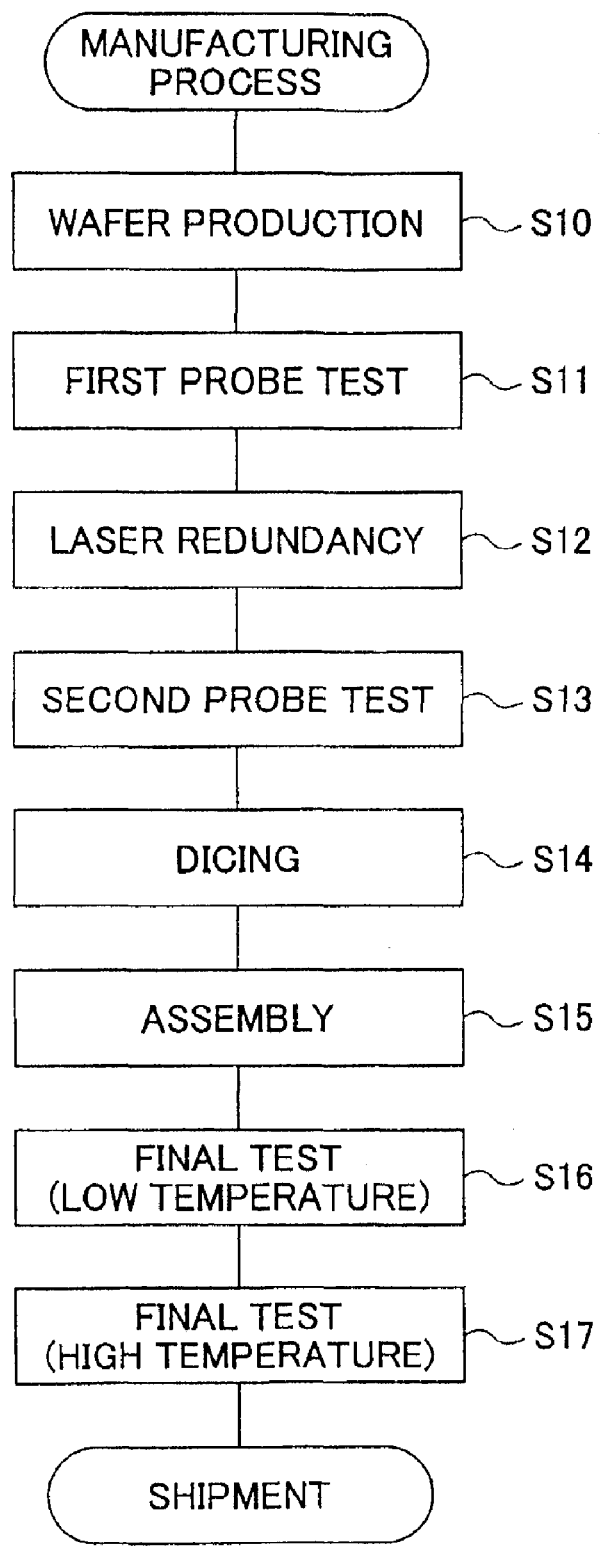
FIG. 19 is a diagram showing steps in a process of manufacturing a semiconductor device.

FIG. 19 is an example of a method for manufacturing the semiconductor device according to the present embodiment. In a step 10 shown in the diagram (steps are abbreviated as "S" in the diagram), when the wafer 35 for the first semiconductor chip 11A (see FIG. 8) as well as the wafer for the second semiconductor chip 12A (not shown in the diagram) are manufactured, a first probe test is conducted for each of the manufactured wafers (step 11). At this time, as described above, the test probe 34 contacts the probe contacting portion 47B of the oblong-shaped pad 46 and a predetermined test is conducted.

When this first probe text is completed, based on the test results a laser redundant process is conducted (step 12). Then, once again, a second probe test is conducted of the laser redundant processed wafer, with a determination made as to whether the redundant circuits are operating normally or not (step 13). In this second probe test as well, the test probe 34 contacts the probe contacting portion 47B of the oblong-shaped pad 46.

When the second probe test is completed, a dicing operation is conducted (step 14). The wafer is cut into semiconductor chips and the first semiconductor chip 11A as well as the second semiconductor chip 12A are manufactured. Additionally, based on the results of the tests conducted in step 11 as well as step 13, defective chips are removed as well.

Next, in a step 15, the assembly process is carried out. In this assembly process, the first semiconductor chip 11A and the second semiconductor chip 12A are stacked atop the substrate 13 in sequence, with wire bonding (wiring process) performed between the semiconductor chips 11A, 12A as well as between the second semiconductor chip 12A and the substrate 13, as is a molding process to form the resin package 16. When the wire bonding process is carried out, the wires 45 are connected to the bonding portions 47A of the oblong-shaped pads 46.

Next, in a step 16 and a step 17, final testing is conducted of the semiconductor device manufactured as described above. This final testing, involves a low-temperature final test conducted under low-temperature conditions (step 16) and a high-temperature final test conducted under high-temperature conditions (step 17). Then, when final testing has indicated that the product is a good one, the semiconductor device is shipped.

In the present embodiment as described above, two probe tests are conducted (steps 11, 13) before the wire bonding process (wiring step) is carried out, as a result of which oblong-shaped pads 46 are contacted twice by the test probe 34. When contacted by the test probe 34, terminal damage such as unevenness appears in the oblong-shaped pad 46. Accordingly, even when a wire 45 is jointed to a pad that has suffered terminal damage a good connection cannot be expected.

However, by separating the oblong-shaped pad 46 into a bonding portion 47A and a probe contacting portion 47B and contacting the test probe 34 only to the probe contacting portion 47B as in the present embodiment, so even if the probe is contacting a plurality of times, the bonding portion 47A that is contacted by the wires 45 maintains a flat surface without any unevenness. Accordingly, the strength of the contact between the wire 45 and the oblong-shaped pad 46 can be increased, and as a result the reliability of the semiconductor device can be improved.

It should be noted that the shape of the pad needed to achieve the effects of the present embodiment is not limited to being oblong. For example, as shown in FIG. 18B, two square pads can be aligned in the direction indicated by arrow X in FIG. 18B, with the wire 45 being connected to one of the pads used as a bonding pad 48 and the test probe 34 being contacted against the other pad used as a probe contacting pad 49, and further, the pads 48, 49 being electrically connected by wiring 49A. Additionally, the positioning of the bonding pad 48 as well as the positioning of the probe contacting pad 49 are such as to alternate in the direction indicated by arrow Y in the diagram. Such a configuration as described above can also achieve the same effects as the oblong-shaped pads 46 shown in FIG. 18A.

Next, a description will be given of a fifth embodiment of the present invention.

Figure 20:
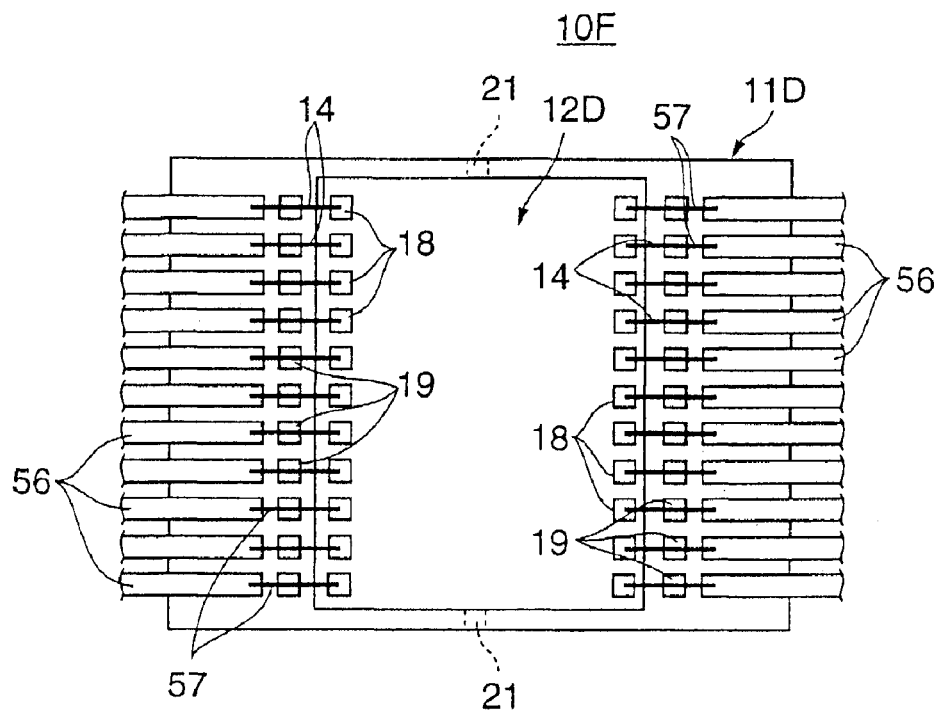
FIG. 20 is a plan view of a semiconductor device according to a fifth embodiment of the present invention.

FIG. 20 is a plan view of a semiconductor device 10F according to a fifth embodiment of the present invention, in a state in which the resin package 16 has been removed.

The semiconductor device 10F according to the present embodiment is characterized by positioning the first pads 19 provided on a first semiconductor chip 11D positioned at a lower layer so as to be adjacent to an outer peripheral edge of a second semiconductor chip 12D positioned at an upper layer. The configuration of the present embodiment is particularly effective where the chip sizes of the first semiconductor chip 11D and the second semiconductor chip 12D are very different. A description will now be given of the reason therefore, with reference to FIG. 24 as well as FIG. 25.

Figure 24:
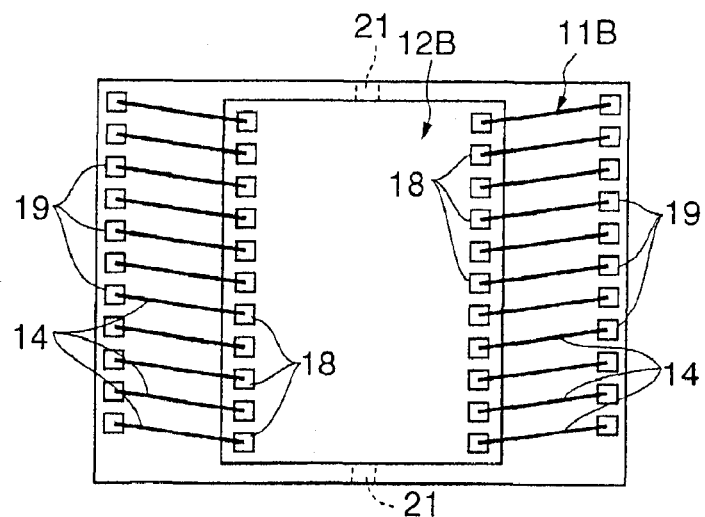
FIG. 24 is a reference diagram for describing a semiconductor device according to a fifth embodiment of the present invention.

FIG. 24 shows a conventional semiconductor device in which the chip sizes of the first semiconductor chip 11B and the second semiconductor chip 12B are very different. As shown in the diagram, conventionally in general the first pads 19 and the second pads 18 are formed in the vicinity of the outer peripheral edges of the semiconductor chips 11B, 12B, so a problem arises in that when attempting to connect the pads 18, 19 via the wires 14 when the chip sizes are very different means that the length of the wires increases. As the wire length increases, the impedance and parasitic capacitance also increase, degrading signal transmission speed.

Figure 25:
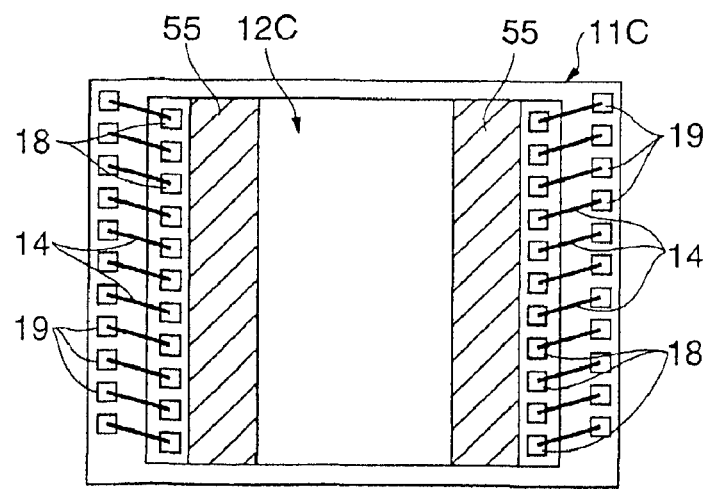
FIG. 25 is a reference diagram for describing a semiconductor device according to a fifth embodiment of the present invention.

Also conventionally, semiconductor devices do exist in which, as shown in FIG. 25, an extension portion is provided on the second semiconductor chip 12C in order to deliberately increase the surface area of the second semiconductor chip 12C, and by so doing shorten the length of the wires 14. However, such a configuration leads to the formation of an unused region that is the extension portion 55 within the second semiconductor chip 12C itself, which runs counter to the attempt to make the device more compact and at a lower cost.

By contrast, in the semiconductor device 10F according to the present embodiment, the shape of the second semiconductor chip 12D is left unchanged, with the pads 19 provided on the first semiconductor chip 11D positioned at a lower layer being positioned in the vicinity of the outer peripheral edge of the second semiconductor chip 12D. Accordingly, no unneeded space is formed on the semiconductor chips 11D, 12D and the length of the wires 14 provided between the semiconductor chips 11D, 12D can be shortened, so impedance can be reduced and signal speed can be improved.

Additionally, with the configuration of the present embodiment, the pads 19 are positioned toward an interior of the first semiconductor chip 11D. However, such a configuration resembles the so-called LOC (Lead On Chip) structure. Accordingly, leads 56 are formed so as to extend to the top of the first semiconductor chip 11D and these leads 56 and the pads 19 are connected by wires 57, so that the length of the wiring between the leads 56 and the pads 19 can also be shortened.

Figure 21:
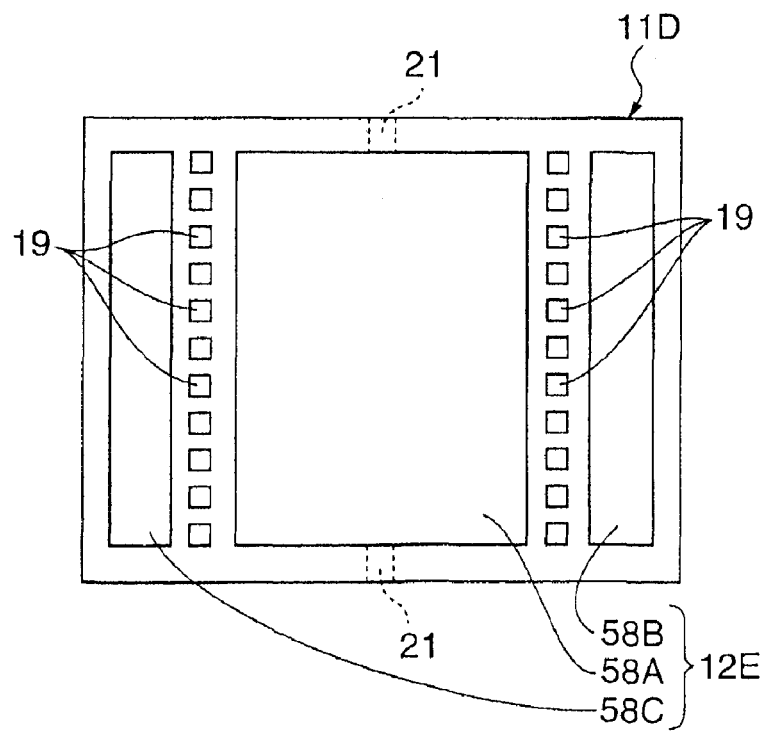
FIG. 21 is a plan view of a first semiconductor chip of a semiconductor device according to a fifth embodiment of the present invention.

FIG. 21 is a plan view of the first semiconductor chip 11D that forms part of the semiconductor device 10F. As described above, the first semiconductor chip 11D is configured so that the pads 19 are formed further toward the interior thereof than the conventional pads. With the line of these pads 19 as a border the first semiconductor chip 11D is divided into three regions, with logic circuit groups formed in each of the regions. That is, the first semiconductor chip 11D is demarcated into logic circuit groups 58A–58C by the pad line.

Accordingly, together with a logic circuit group 58A provided inside the two lines of pads formed on the first semiconductor chip 11D, logic circuit groups 58B and 58C are formed on the outside of the pad lines. As a result, the formation of so-called dead space on the first semiconductor chip 11D can be prevented and a more compact semiconductor device 10F can be achieved even as the length of the wires 14 can be shortened as described above.

Figure 22:
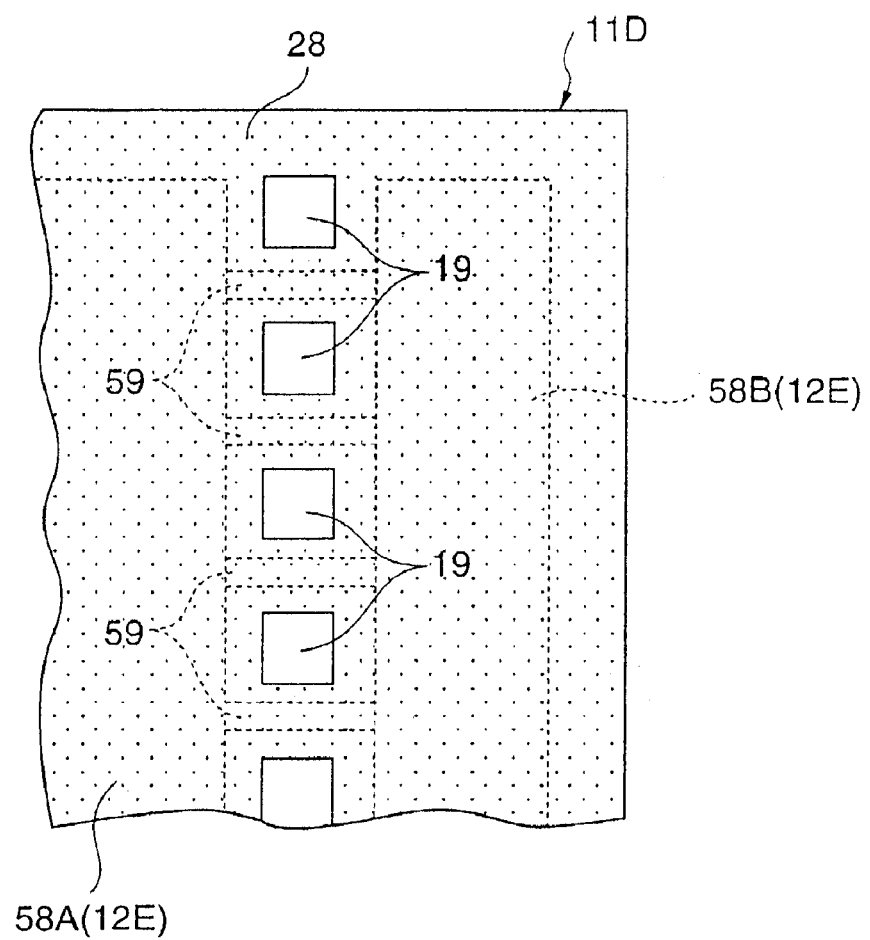
FIG. 22 is an enlarged plan view of the area of a pad of the first semiconductor chip shown in FIG. 21.
Figure 23:
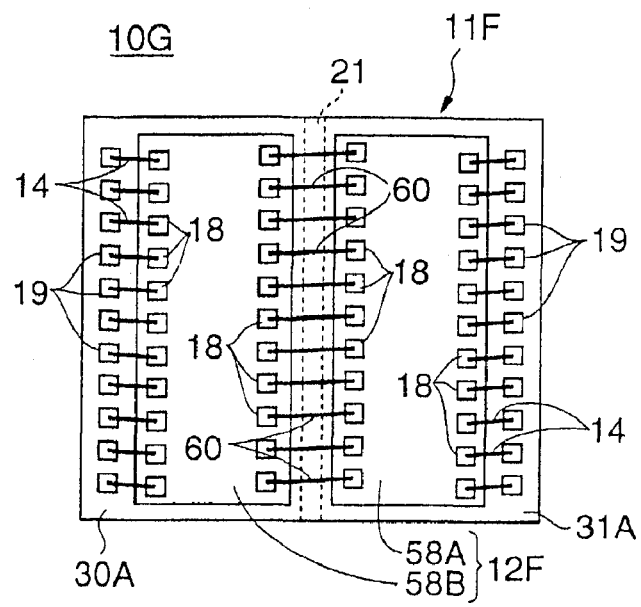
FIG. 23 is a plan view of a semiconductor device according to a sixth embodiment of the present invention.

FIG. 22 is an enlarged view of the area at which the pads 19 of the first semiconductor chip 11D are formed. As described above, in the present embodiment the pads 19 are positioned at an inner side of the first semiconductor chip 11D, so the three logic circuit groups 58A–58C are formed by the pads 19. Additionally, the logic circuit groups 56A-58C are not completely independent circuits, so it is necessary to provide wiring between the logic circuit groups 58A–58C.

Thus, in the present embodiment, inter-chip connective wiring 59 that connects the logic circuit groups 58A–58C to each other is provided at a position separate from adjacent pairs of pads 19. As a result, the inter-chip connective wiring 59 is positioned along both sides of the pads 19 (top and bottom sides in the diagram). Compared to a configuration in which the logic circuit groups 58A–58C are connected to each other using wire bonding, providing the inter-chip connective wiring 59 that connects the logic circuit groups 58A–58C using a location separate from adjacent pairs of pads as described above makes it easy to carry out wiring.

Additionally, the inter-chip connective wiring 59 can be formed at the same time as the logic circuit groups 58A–58C are formed on the chip, so these can be formed easily and inexpensively without any increase in the number of manufacturing steps. Further, the inter-chip connective wiring 59 is formed using the location at which the pads 19 are provided, so as compared to a configuration in which the inter-chip connective wiring is formed at a separate position the first semiconductor chip 11D can be made more compact. It should be noted that although in the example shown in FIG. 22 the inter-chip connective wiring 59 is depicted as extending in a lateral direction in the diagram, it is also possible to extend the wiring in a longitudinal direction in the diagram as well.

A description will now be given of a sixth embodiment of the present invention.

The semiconductor device 10G according to the present embodiment is characterized by dividing a second semiconductor chip 12F at an upper layer into a first logic circuit chip 58A and a second logic chip circuit 58B. Additionally, a first semiconductor chip 11F, as with the first semiconductor chip 11A provided in the first through fourth embodiments as described previously, is provided with pads 19 positioned near the outer peripheral edge of the chip.

Accordingly, by dividing the second semiconductor chip 12F into a plurality of (in the present embodiment two) logic circuit chips 58A, 58B and separating the positions of the logic circuit chips 58A, 58B, the second pads 18 provided on the logic circuit chips 58A, 58B and the first pads 19 provided on the first semiconductor chip 11F can be brought closer together.

Accordingly, in the semiconductor device 10G according to the present embodiment as well, no unnecessary regions are formed on the semiconductor chips 11F, 12F, the length of the wires 14 provided between the semiconductor chips 11F, 12F can be shortened, and impedance can be reduced and signal speed can be improved.

Additionally, by dividing the second semiconductor chip 12F into a plurality of logic circuit chips 58A, 58B, the need arises to connect the logic circuit chips 58A, 58B electrically. As a result, inter-chip connective wire 60 is provided between the logic circuit chips 58A, 58B. This inter-chip connective wire 60 can be laid at the same time as the wire bonding of the wires 14.

A description will now be given of a seventh embodiment of the present invention.

Figure 26:
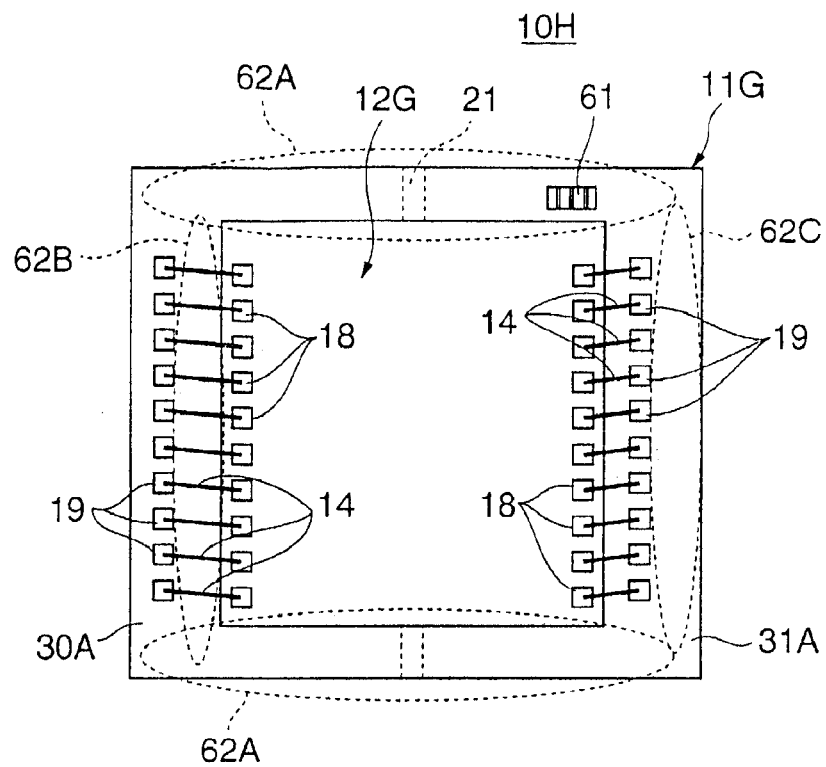
FIG. 26 is a plan view of a semiconductor device according to a seventh embodiment of the present invention.

FIG. 26 is a plan view of a semiconductor device 10H according to a fifth embodiment of the present invention, in a state in which the resin package 16 has been removed.

The semiconductor device 10H of the present embodiment has a laser fuse window 61 formed on a first semiconductor chip 11G. The laser fuse window 61 is provided in order to improve the redundancy of the first semiconductor chip 11G.

That is, assuming a case in which the first semiconductor chip 11G is a DRAM, then a multiplicity of cells are formed within the first semiconductor chip 11G. However, if even one of this multiplicity of cells is defective, then the first semiconductor chip 11G becomes defective.

Figure 27:
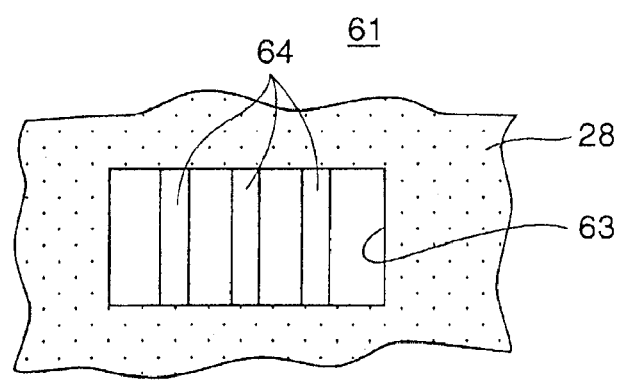
FIG. 27 is an enlarged plan view of a laser fuse window provided on a semiconductor device according to a seventh embodiment of the present invention.
Figure 28:
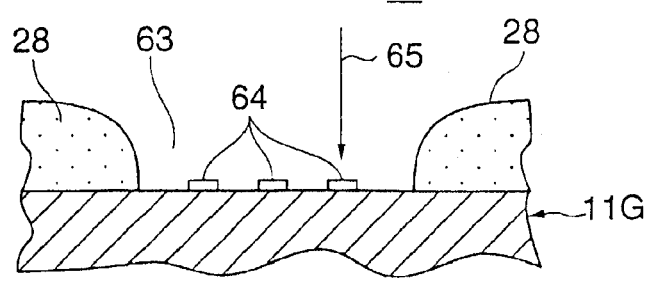
FIG. 28 is an enlarged cross-sectional view of a laser fuse window provided on a semiconductor device according to a seventh embodiment of the present invention.

In such a configuration economy deteriorates sharply, so spare cells are formed in advance inside the first semiconductor chip 11G and at the same time the laser fuse window 61 is provided. Fuse wiring 64 is laid inside the laser fuse window 61, as shown in FIG. 27 as well as FIG. 28. By cutting this fuse wiring 64 with a laser beam 65 (see FIG. 28), a switch can be made from a proper cell (a cell in which a malfunction has occurred) to a spare cell. By using such a configuration, the occurrence of defective chips can be reduced and economy can be improved (this process is called redundancy process).

The semiconductor device 10H according to the present embodiment positions the fuse wiring 64 either ① between an outer peripheral edge of the first semiconductor chip 11G and an outer peripheral edge of the second semiconductor chip 12G, where terminals do not exist (the area formed by the dashed line 62A in FIG. 26), ② separate from the first pads 19 formed on the first semiconductor chip 11G and the second pads 18 formed on the second semiconductor chip 12G (the area formed by the dashed line 62B in FIG. 26), or ③ further out from a position at which the first pads 19 are formed on the first semiconductor chip 11G (the area formed by the dashed line 62C in FIG. 26).

According to the above-described structure, even in an MCP structure that stacks the second semiconductor chip 12G on top of the first semiconductor chip 11G, the fuse window 64 is formed at a position outside the region in which the first and second semiconductor chips 11G, 12G overlap. That is, even if the first and second semiconductor chips 11G, 12G are stacked, the fuse window 64 is certain to be exposed externally.

Assuming a case in which the fuse window 64 is positioned inside the region in which the first and second semiconductor chips 11G, 12G overlap, then because a gap occurs at the location at which the fuse wiring 64 is formed, there is a chance that peeling or cracking may occur between the semiconductor chips 11G, 12G during heating while mounting.

However, in the present embodiment, as described above, even if the semiconductor chips 11G, 12G are stacked, the fuse window 64 is always exposed externally, so the occurrence of peeling and cracking can be securely prevented.

Additionally, it also becomes possible to conduct the redundancy processing using the fuse window 64 after stacking the first and second semiconductor ships 11G, 12G. Further, after redundancy processing is completed the fuse window 64 can also be filled in with resin or the like. By so doing, the entry of water and the like into the interior of the semiconductor device from the fuse window 64 can be prevented.

A description will now be given of an eighth embodiment of the present invention.

Figure 29:
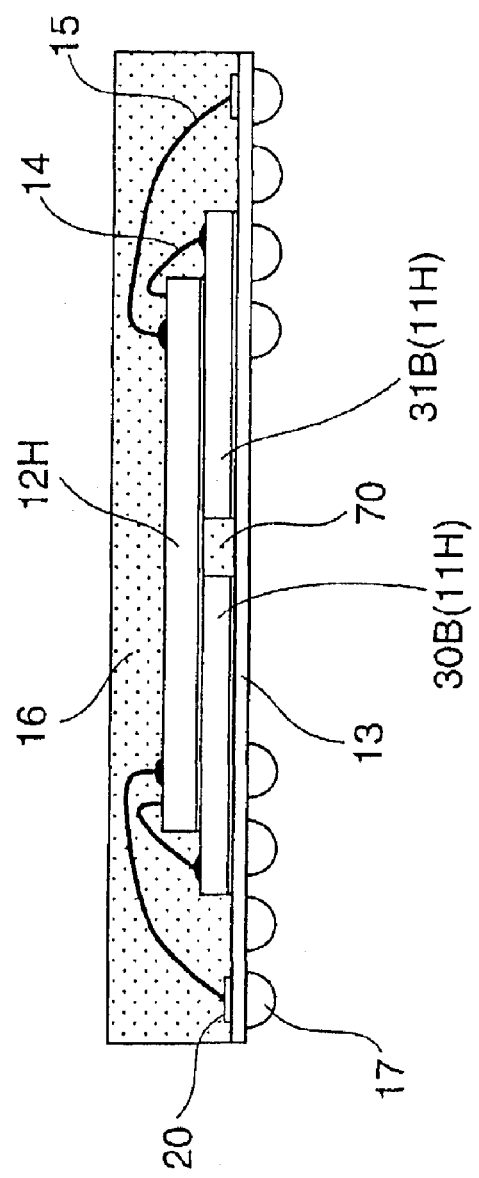
FIG. 29 is a cross-sectional view of a semiconductor device according to an eighth embodiment of the present invention.
Figure 30:
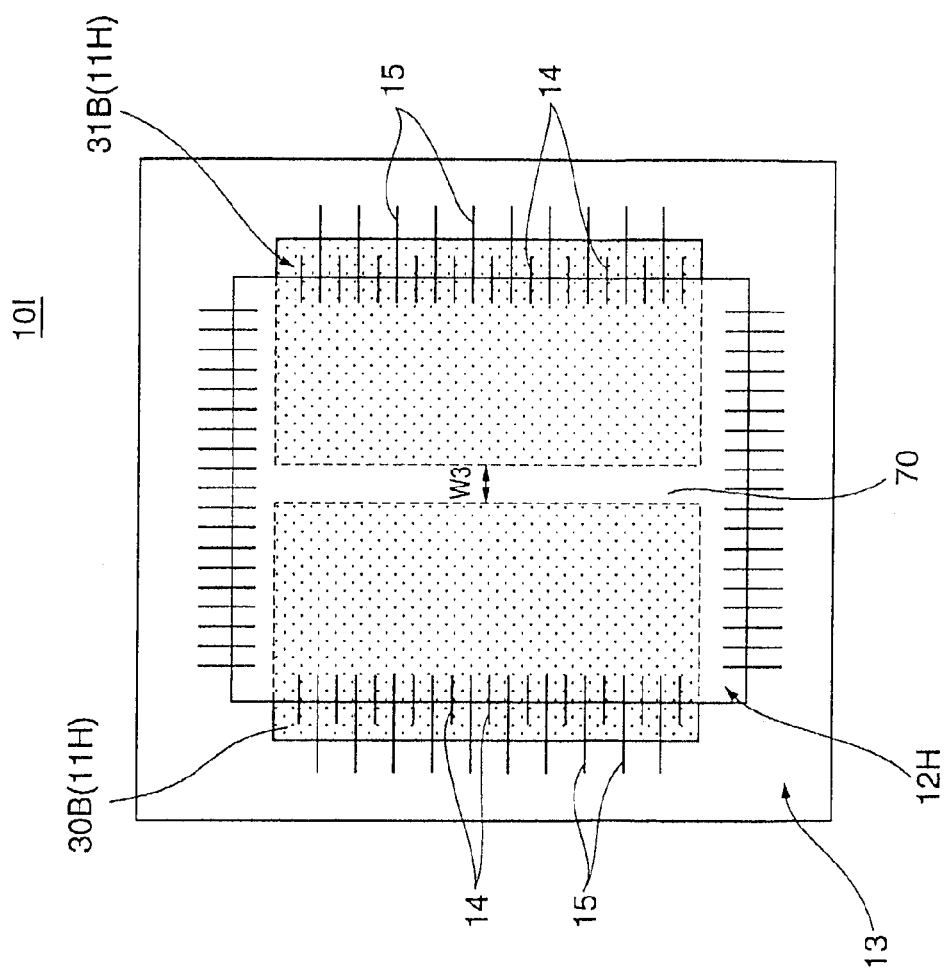
FIG. 30 is a plan view of a semiconductor device according to an eighth embodiment of the present invention.

FIG. 29 is a cross-sectional view of a semiconductor device 10I that is an eighth embodiment of the present invention. FIG. 30 is a plan view of the semiconductor device 10I, in a state in which the resin package 16 has been removed.

In the semiconductor devices 10A–10H according to the embodiments described above, the first semiconductor chip 11A–11G positioned at the bottom has comprised a first functional chip 30A and a second functional chip 31A that are joined by an unsliced scribe line 21.

By contrast, the semiconductor device 10I according to the present embodiment divides the first semiconductor chip 11H into a plurality (in the present embodiment two) of functional chips 30B, 31B and also provides an open space 70.

Additionally, the second semiconductor chip 12H is stacked atop the divided first and second functional chips 30B, 31B.

Additionally, in the present embodiment as well, the first semiconductor chip 11H positioned at the bottom is a memory chip, whereas the second semiconductor chip 12H positioned on the top is a logic chip having a function different from that of the first semiconductor chip 11H. Further, when the first semiconductor chip 11H is divided, it is divided by storage capacity.

That is, assuming a case in which it is desirable that the first semiconductor chip 11H have 64 Mbits of storage capacity, then the first and second semiconductor chips 30B, 31B will each have a storage capacity of 32 Mbits after division. As described above, the yield from the manufacture of the 32 Mbit semiconductor chip is better than from the manufacture of the 64 Mbit semiconductor chip, so the yield of the semiconductor device 10I according to the present embodiment can be improved.

It should be noted that the technique of laying the first wires 14 and the second wires 15 of the semiconductor device 10I of the present embodiment is the same as that for the semiconductor device 10A of the first embodiment described above. That is, only power wiring and signal wiring are provided between the first semiconductor chip 11H that is the memory chip and an external connection terminal (not shown in the diagram), and only signal wiring is provided between the second semiconductor chip 12H that is the logic chip and an external connection terminal (not shown in the diagram).

Figure 31:
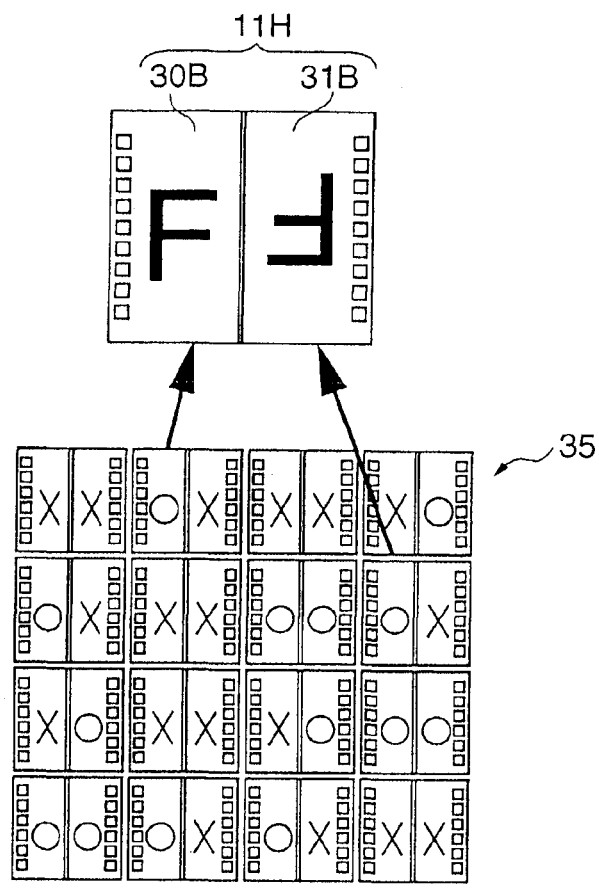
FIG. 31 is a diagram illustrating a combination of functional chips sliced from a wafer.

Here, a description will be given of a method for cutting out the first and second functional chips 30B, 31B, using FIG. 31. The first and second functional chips 30B, 31B used in the present invention, as shown in FIG. 31, are also arranged so that the second functional chip 31B is rotated 180 degrees with respect to the first functional chip 30B. Accordingly, when cutting out the first and second functional chips 30B, 31B from the semiconductor substrate, the freedom with which the cutting out can be accomplished is improved.

In the present embodiment in particular, unlike the embodiments previously described, in which the first semiconductor chip 11A that joins the functional chips 30A, 31A with an unsliced scribe line is cut out, the first and second functional chips 30B, 31B are each cut out individually. As a result, the yield can be further improved as compared to a case in which the first semiconductor chip 11A is cut out from the wafer 35.

A description thereof is given using FIG. 31. In the case of cutting out the first semiconductor chip 11A that joins the functional chips 30A, 31A by a scribe line 21, both the functional chips 30A, 31A must be good products. If now we assume that those chips marked with a ○ in FIG. 31 represent good chips and those chips marked with a X in FIG. 31 represent defective chips, then from the wafer 35 shown in the diagram only three first semiconductor chips 11A can be cut out.

However, because the second semiconductor chip 31B is rotated 180 degrees with respect to the first semiconductor chip 30B, in their cut out individualized states the first semiconductor chip 30B and the second semiconductor chip 31B are the same. Accordingly, as shown in FIG. 31, if there are 14 good chips, then seven (14÷2) of the first semiconductor chips 11A shown in the top part of the diagram can be formed.

Thus, according to the present embodiment, a multiplicity of first semiconductor chips 11H can be obtained from a single wafer 35, and yield can be improved and semiconductor device 10I cost can be decreased.

Figure 32:
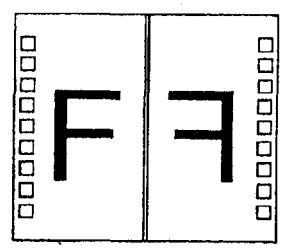
FIG. 32 is a diagram showing a pair of functional chips disposed in a mirror-image arrangement.
Figure 33:
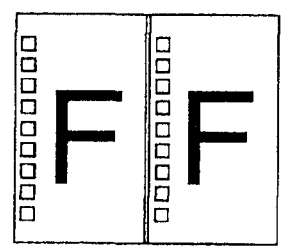
FIG. 33 is a diagram showing a pair of functional chips disposed in a shift arrangement.

It should be noted that when the first functional chip and the second functional chip are disposed in a mirror-image arrangement as shown in FIG. 32, or when the first functional chip and the second functional chip are disposed in a shifted arrangement as shown in FIG. 33, the first functional chip and the second functional chip differ and hence the effects of the present embodiment cannot be attained.

Thus, returning once again to FIGS. 29 and 30, a description will continue of the semiconductor device 10I.

As described above, in the semiconductor device 10I according to the present embodiment, an open space is formed between the first functional chip 30B and the second functional chip 31B. As a result, when forming the resin package 16, there is a danger that a gap will be formed in this open space 70. If a gap is formed in the open space 70, then there is a risk that cracks and the like might appear due to expansion of the air in the gap during heating while mounting.

Accordingly, in the present embodiment the separation distance of the open space 70 (shown in FIG. 30 by arrow W3) is set to a distance that permits the entry of the resin that forms the resin package 16 during resin sealing. Specifically, the separation distance W3 of the open space 70 is set to 0.15 mm or more.

According to such a configuration, the resin that forms the resin package 16 during resin sealing can securely penetrate into the open space 70 and form the resin package 16 inside the open space 70. Accordingly, the occurrence of a gap inside the resin package 16 can be prevented, and the occurrence of cracks and the like during heating can be reduced even though the first and second functional chips 30B, 31B are separated, and so the reliability of the semiconductor device 10I can be improved.

A description will now be given of a ninth embodiment of the present invention.

Figure 34:
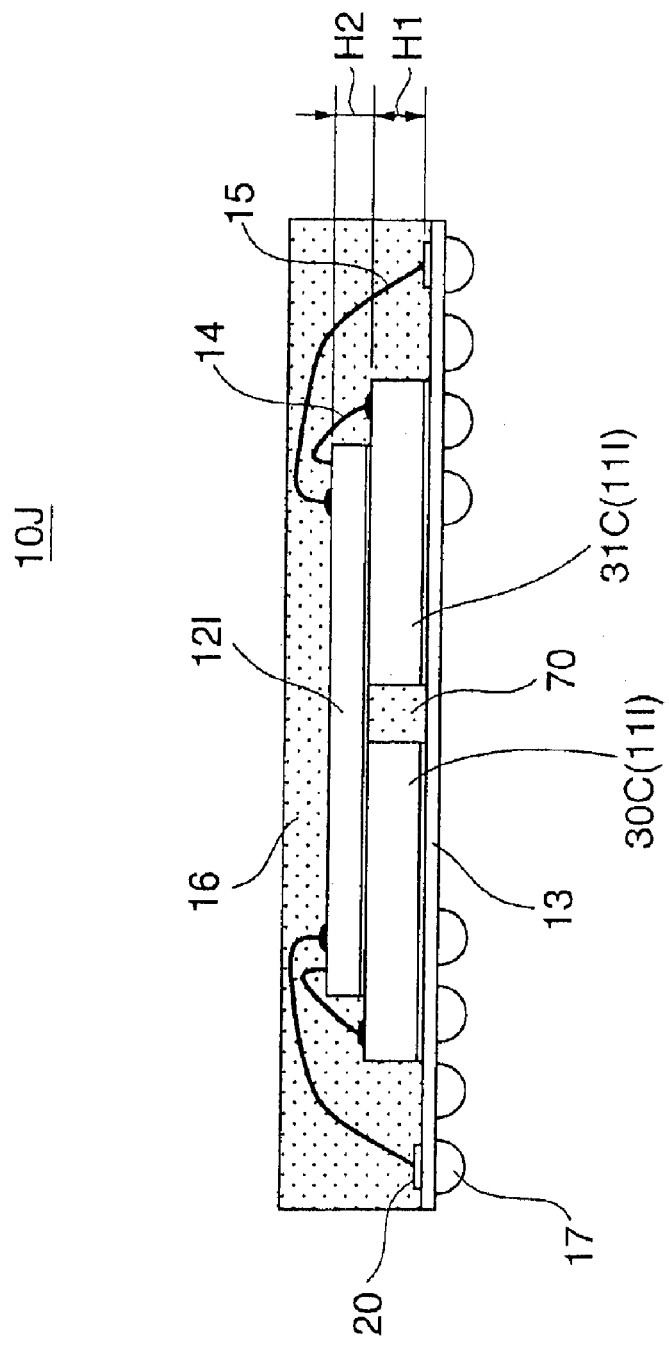
FIG. 34 is a cross-sectional view of a semiconductor device according to a ninth embodiment of the present invention.

FIG. 34 is a cross-sectional view of a semiconductor device 10J according to a ninth embodiment of the present invention. A thickness Hi of a first semiconductor chip 11I (composed of a first functional chip 30C and a second functional chip 31C) of the semiconductor device 10J according to the present embodiment is made larger than a thickness H2 of the second semiconductor chip 12A 12I (H1>H2).

With such a configuration, a height of the open space 70 between the first functional chip 30C and the second functional chip 31C is higher than that of the semiconductor device 10I shown in FIG. 29 (in which thicknesses of the second functional chips 30B, 31B are substantially the same).

Accordingly, the filling of the open space 70 with the resin that forms the resin package 16 can be improved, and the occurrence of a gap inside the open space 70 can be prevented. Accordingly, with the semiconductor device 10I according to the present embodiment as well, damage due to the occurrence of cracks and the like during heating can be reduced and reliability can be improved.

It should be noted that, ordinarily, the first semiconductor chip 11I (the first and second functional chips 30C, 31C) is back ground before being mounted on the semiconductor device 10J. Accordingly, by adjusting the extent of the ground appropriately, formation of a first semiconductor chip 11I that has a thickness greater than that of the second semiconductor chip 12I can be carried out easily.

It should be noted that the above-described embodiments are configured so that the resin that makes up the resin package fills the open space 70 when the resin package 16 is formed. However, before the formation of the resin package 16, the open space 70 may be filled with an underfill 70.

A description will now be given of a tenth embodiment of the present invention.

Figure 35:
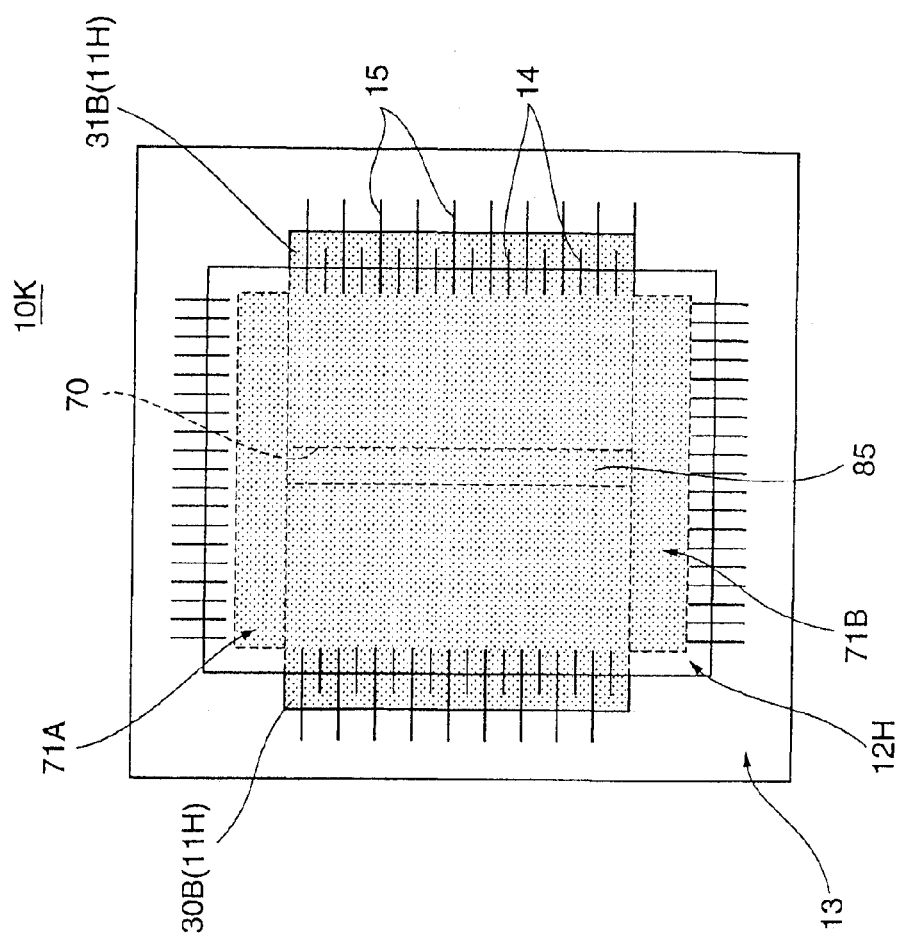
FIG. 35 is a plan view of a semiconductor device according to a tenth embodiment of the present invention.

FIG. 35 is a plan view of a semiconductor device 10K according to a tenth embodiment of the present invention, in a state in which the resin package 16 has been removed. The semiconductor device 10K according to the present embodiment is characterized by providing dummy chips 71A, 71B at the sides of the divided functional chips 30B, 31B so as to block up the open space 70, and in so doing an interior of a concave portion formed by the functional chips 30B, 31B as well as the dummy chips 71A, 71B is filled with a die bonding material 85.

The dummy chips 71A, 71B are chips on which circuits have not been formed, and the functional chips 30B, 31B each have the same thickness. Accordingly, even with the provision of the dummy chips 71A, 71B, a second semiconductor chip 12H can still be stacked thereon. Additionally, a bonding method, for example, can be used for the filling by the die bonding material 85 of the interior of the concave portion surrounded by the functional chips 30B, 31B as well as the dummy chips 71A, 71B. This filling by the die bonding material 85 is conducted so as to fill the above-described concave portion.

It should be noted that, in the present embodiment, the dummy chips 71A, 71B on which no circuits are formed block up the open space 70 at both ends thereof. However, instead of these dummy chips 71A, 71B it is also possible to use active chips on which circuits are formed.

By providing dummy chips 71A, 71B that are a third chip at both ends of the divided functional chips 30B, 31B according to the present embodiment as described above, the interior of the open space 70 can be filled with the die bonding material 85. Accordingly, the appearance of gaps in the open space 70 can be prevented and the occurrence in the semiconductor device 10K of damage such as cracks and the like during heating can be reduced. Accordingly, with the present embodiment as well, the reliability of the semiconductor device 10K can be improved.

The present invention is not limited to the specifically disclosed embodiments, and a variety of variations and embodiments may be made without departing from the scope of the claimed invention.

What is claimed is:

1. A semiconductor device sealed in one package comprising:

a first semiconductor chip having a first function; and a second semiconductor chip having a second function, wherein the first semiconductor chip has an unsliced scribe line, wherein the first semiconductor chip and the second semiconductor chip are stacked in the package, and wherein the semiconductor chip with the larger area is the first semiconductor chip and the second semiconductor chip is disposed at a lower layer with respect to a direction of stacking.

2. A semiconductor device as claimed in claim 1, wherein the first function and the second function are different functions.

3. The semiconductor device as claimed in claim 1, wherein the first semiconductor chip having the first function is a memory chip and the second semiconductor chip having the second function is a logic chip, wherein power wiring and signal wiring is provided between the logic chip and an external connection terminal, wherein only power wiring is provided between the memory chip and the external connection terminal, and wherein only signal wiring is provided between the memory chip and the logic chip.

4. A semiconductor device sealed in one package comprising:

a first semiconductor chip having a first function; and a second semiconductor chip having a second function, wherein the first semiconductor chip has an unsliced scribe line, and wherein the first semiconductor chip is a memory chip, and further, a first functional chip and a second functional chip formed by the scribe line have an identical configuration.

5. The semiconductor device as claimed in claim 4, wherein the first semiconductor chip having the first function is a memory chip and the second semiconductor chip having the second function is a logic chip, wherein power wiring and signal wiring is provided between the logic chip and an external connection terminal, wherein only power wiring is provided between the memory chip and the external connection terminal, and wherein only signal wiring is provided between the memory chip and the logic chip.

6. A semiconductor device sealed in one package comprising:

a first semiconductor chip having a first function; and a second semiconductor chip having a second function, wherein the first semiconductor chip has an unsliced scribe line, wherein the first semiconductor chip is a memory chip and the second semiconductor chip is a logic chip, wherein power wiring and signal wiring are provided between the logic chip and an external connection terminal, wherein only power wiring is provided between the memory chip and the external connection terminal and wherein only signal wiring is provided between the memory chip and the logic chip.

7. A semiconductor device comprising:

a support substrate having an external connection substrate;

a plurality of semiconductor chips stacked on the support substrate; and a package sealing the plurality of semiconductor chips, wiring from the plurality of semiconductor chips, among the wiring those that are unconnected to the external connection terminal being directly connected between individual semiconductor chips, wherein of the plurality of semiconductor chips, one of the semiconductor chips is a memory chip and another semiconductor chip is a logic chip stacked on the memory chip, wherein power wiring and signal wiring are provided between the logic chip and an external connection terminal, wherein only power wiring is provided between the memory chip and the external connection terminal, and wherein only signal wiring is provided between the memory chip and the logic chip.

8. A semiconductor substrate comprising:

a first functional chip that functions as a semiconductor chip;

a second functional chip that functions as a semiconductor chip and is provided adjacent to the first functional chip; and scribe lines that respectively define the first functional chip and the second functional chip, wherein the positioning of the first functional chip and the second functional chip are such that, through selection of the scribe line for a slicing process, only the first functional chip may he cut out, or only the second functional chip may be cut out, or a region that combines the first functional chip and the second functional chip may be cut out wherein the scribe lines includes a scribe line to be sliced and a scribe line not to be sliced, wherein the scribe line to be sliced and the scribe line not to be sliced cross at right angles each other, and wherein a width of the scribe line not to be sliced is narrower than a width of the scribe line to be sliced.

9. The semiconductor substrate as claimed in claim 8, wherein wiring that connects adjacent functional chips is not formed where the scribe line is positioned.

10. A semiconductor device sealed in one package comprising:

a first semiconductor chip having a first function; and a second semiconductor chip having a second function, wherein the first semiconductor chip has an unsliced scribe line, and further, wiring is not provided where the scribe line is positioned.

11. A semiconductor substrate comprising:

a first functional chip that functions as a semiconductor chip;

a second functional chip that functions as a semiconductor chip and is provided adjacent to the first functional chip; and scribe lines that respectively define the first functional chip and the second functional chip, the second functional chip being the first functional chip rotated 180 degrees.

12. A semiconductor device comprising a first semiconductor chip, in which a first functional chip and a second functional chip are joined via an unsliced scribe line, and a second semiconductor chip sealed in one package, the second functional chip that forms the first semiconductor chip being the first functional chip rotated 80 degrees.

13. A semiconductor device comprising:

a support substrate having an external connection terminal;

a plurality of semiconductor chips stacked on the support substrate; and a package sealing the plurality of semiconductor chips, wiring being extended from the plurality of semiconductor chips, among the wiring those that are unconnected to the external connection terminal being directly connected between individual semiconductor chips, a first electrostatic protection circuit being provided on a terminal of a semiconductor chip connected to the external connection terminal, and either a second electrostatic protection circuit being provided on one terminal of a pair of terminals to which wiring unconnected to the external connection terminal is connected, or the second electrostatic protection circuits being provided on both terminals of the pair of terminals.

14. The semiconductor device as claimed in claim 13, wherein:

a configuration of the second electrostatic protection circuit provided on the terminal to which wiring not connected to the external connection terminal is connected is smaller than a configuration of the first electrostatic protection circuit provided on the terminal of the semiconductor chip connected to the external connection terminal.

* * * * *